United States Patent
Lee et al.

(10) Patent No.: US 9,721,930 B2
(45) Date of Patent: Aug. 1, 2017

(54) SEMICONDUCTOR PACKAGE AND METHOD FOR FABRICATING THE SAME

(71) Applicant: Samsung Electronics Co., Ltd., Suwon-si, Gyeonggi-do (KR)

(72) Inventors: Hyoungjoo Lee, Suwon-si (KR); Minsoo Kim, Gumi-si (KR); Teak Hoon Lee, Daejeon (KR); Young Kun Jee, Cheonan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/168,236

(22) Filed: May 30, 2016

(65) Prior Publication Data
US 2017/0005075 A1 Jan. 5, 2017

(30) Foreign Application Priority Data
Jun. 30, 2015 (KR) ........................ 10-2015-0093309

(51) Int. Cl.
*H01L 23/52* (2006.01)
*H01L 25/065* (2006.01)
(Continued)

(52) U.S. Cl.
CPC .... *H01L 25/0657* (2013.01); *H01L 23/49838* (2013.01); *H01L 25/0652* (2013.01);
(Continued)

(58) Field of Classification Search
CPC . H01L 2225/06513; H01L 2225/06541; H01L 25/0657; H01L 2225/06517; H01L 23/49838
(Continued)

(56) References Cited

U.S. PATENT DOCUMENTS 7,491,582 B2 2/2009 Yokoyama et al.
8,450,150 B2 5/2013 Maki et al.
(Continued)

FOREIGN PATENT DOCUMENTS

JP 2003282819 A 10/2003
JP 2012222038 A 11/2012
(Continued)

*Primary Examiner* — Luan C Thai
(74) *Attorney, Agent, or Firm* — Renaissance IP Law Group LLP

(57) ABSTRACT

A semiconductor package includes a first semiconductor chip stacked on a package substrate in which a first surface of the first semiconductor chip faces the package substrate and a second surface that is opposite to the first surface, a second semiconductor chip stacked on the first semiconductor chip that includes a third surface facing the first semiconductor chip and a fourth surface that is opposite to the third surface, and an integral adhesive structure that substantially continuously fills a first space between the package substrate and the first semiconductor chip and a second space between the first and second semiconductor chips. The integral adhesive structure includes an extension protruding from outer sidewalls of the first and second semiconductor chips. The extension has one continuously convex sidewall between a level of the first surface and a level of the fourth surface.

18 Claims, 19 Drawing Sheets

(51) Int. Cl.
*H01L 23/498* (2006.01)
*H01L 25/00* (2006.01)
*H01L 23/31* (2006.01)

(52) U.S. Cl.
CPC .......... *H01L 25/50* (2013.01); *H01L 23/3128* (2013.01); *H01L 2224/0401* (2013.01); *H01L 2224/0557* (2013.01); *H01L 2224/13025* (2013.01); *H01L 2224/16145* (2013.01); *H01L 2224/16227* (2013.01); *H01L 2224/17181* (2013.01); *H01L 2224/32145* (2013.01); *H01L 2224/32225* (2013.01); *H01L 2224/73104* (2013.01); *H01L 2224/73204* (2013.01); *H01L 2225/06513* (2013.01); *H01L 2225/06517* (2013.01); *H01L 2225/06541* (2013.01); *H01L 2924/15311* (2013.01); *H01L 2924/18161* (2013.01)

(58) Field of Classification Search
USPC ........................................................ 257/774
See application file for complete search history.

(56) References Cited

U.S. PATENT DOCUMENTS

| | | | |
|---|---|---|---|
| 8,604,615 B2 * | 12/2013 | Lee | ............... H01L 23/3128 257/685 |
| 9,040,412 B2 | 5/2015 | Ma et al. | |
| 9,184,130 B2 | 11/2015 | Henderson et al. | |
| 2006/0073637 A1 | 4/2006 | Yokoyama et al. | |
| 2009/0181476 A1 | 7/2009 | Buchwalter et al. | |
| 2010/0261312 A1 | 10/2010 | Maki et al. | |
| 2011/0058348 A1 * | 3/2011 | Sakai | ............... H01L 23/481 361/803 |
| 2014/0098448 A1 | 4/2014 | Henderson et al. | |
| 2014/0342502 A1 | 11/2014 | Ma et al. | |
| 2015/0028474 A1 | 1/2015 | Jang et al. | |
| 2015/0050778 A1 | 2/2015 | Asahi et al. | |

FOREIGN PATENT DOCUMENTS

| | | |
|---|---|---|
| KR | 20070004331 A | 1/2007 |
| KR | 20080065871 A | 7/2008 |

* cited by examiner

SEMICONDUCTOR PACKAGE AND METHOD FOR FABRICATING THE SAME

CROSS-REFERENCE TO RELATED APPLICATION

This U.S. non-provisional patent application claims priority under 35 U.S.C. §119 to Korean Patent Application No. 10-2015-0093309, filed on Jun. 30, 2015, in the Korean Intellectual Property Office, the disclosure of which is hereby incorporated by reference in its entirety.

BACKGROUND

Embodiments disclosed herein relate to a semiconductor package and a method for fabricating the same. More particularly, embodiments disclosed herein relate to a semiconductor package including semiconductor chips stacked on a package substrate and a method for fabricating the same.

As high-capacity, thin and small semiconductor devices and electronic products including the same have been demanded in a semiconductor industry, various package techniques related thereto have been developed. In one of the various package techniques, a plurality of semiconductor chips may be vertically stacked to realize a high-density chip stack. According to this technique, semiconductor chips having various functions may be integrated on a limited area.

SUMMARY

Embodiments disclosed herein may provide a semiconductor package capable of improving mechanical endurance using an adhesive structure functioning as an underfill.

Embodiments disclosed herein may also provide a method for fabricating a semiconductor package capable of effectively performing a bonding process of stacked semiconductor chips.

In one aspect, a semiconductor package may include a first semiconductor chip stacked on a package substrate in which the first semiconductor chip includes a first surface facing the package substrate and a second surface that is opposite to the first surface, a second semiconductor chip stacked on the first semiconductor chip in which the second semiconductor chip includes a third surface facing the first semiconductor chip and a fourth surface that is opposite to the third surface, and an integral adhesive structure, the integral adhesive structure substantially filling a first space between the package substrate and the first semiconductor chip and a second space between the first and second semiconductor chips. The integral adhesive structure may include an extension protruding from outer sidewalls of the first and second semiconductor chips, and the extension may have one continuously convex sidewall between a level of the first surface and a level of the fourth surface.

In an embodiment, a top surface of the extension may be disposed at a lower level than the fourth surface.

In an embodiment, the extension may be in direct contact with a top surface of the package substrate.

In an embodiment, the semiconductor package may further include at least one first connection terminal provided between the first semiconductor chip and the package substrate. The at least one first connection terminal may electrically connect the first semiconductor chip to the package substrate.

In an embodiment, the first semiconductor chip may include at least one first through electrode penetrating the first semiconductor chip from the first surface to the second surface.

In an embodiment, the second semiconductor chip may include at least one second connection terminal electrically connected to the at least one first through electrode.

In an embodiment, the at least one first through electrode may be disposed in a central region of the first semiconductor chip, and the at least one second connection terminal may be vertically aligned with the at least one first through electrode.

In an embodiment, a distance between a pair of opposite sidewalls of the first semiconductor chip may be defined as a first distance, and a distance between a pair of opposite sidewalls of the second semiconductor chip may be defined as a second distance. The first distance may be substantially equal to the second distance.

In an embodiment, the extension may cover the pair of opposite sidewalls of the first semiconductor chip. The extension may also cover portions of the pair of opposite sidewalls of the second semiconductor chip.

In an embodiment, the semiconductor package may further include a molding layer provided on the package substrate to mold the first and second semiconductor chips.

In an embodiment, the semiconductor package may further include a third semiconductor chip disposed between the package substrate and the first semiconductor chip and including a fifth surface facing the package substrate and a sixth surface facing the first semiconductor chip. The integral adhesive structure may further substantially fill a third space between the package substrate and the third semiconductor chip. In this case, the first space may be a space between the first and third semiconductor chips.

In an embodiment, the extension may have one continuously convex sidewall between a level of the fifth surface and the level of the fourth surface.

In an embodiment, the extension may include a first sub-extension and a second sub-extension on the first sub-extension. The first sub-extension may have one first continuously convex sidewall between a level of a top surface of the package substrate and a level of the sixth surface, and the second sub-extension may have one second continuously convex sidewall between the level of the sixth surface and the level of the fourth surface.

In an embodiment, the extension may have a concave sidewall between the first and second sub-extensions.

In an embodiment, the extension may cover a pair of opposite sidewalls of the first semiconductor chip and a pair of opposite sidewalls of the third semiconductor chip.

In an embodiment, the third semiconductor chip may include at least one first through electrode penetrating the third semiconductor chip from the fifth surface to the sixth surface. The first semiconductor chip may include at least one second through electrode penetrating the first semiconductor chip from the first surface to the second surface, and at least one connection terminal electrically connecting the at least one second through electrode to the at least one first through electrode.

In an embodiment, the semiconductor package may further include a third semiconductor chip disposed between the package substrate and the first semiconductor chip, and a fourth semiconductor chip disposed between the package substrate and the third semiconductor chip. The integral adhesive structure may also substantially continuously fill a third space between the third and fourth semiconductor chips and a fourth space between the package substrate and the fourth semiconductor chip. In this case, the first space may be a space between the first and third semiconductor chips.

In an embodiment, the extension may cover sidewalls of the first, third and fourth semiconductor chips.

In another aspect, a semiconductor package may include a first semiconductor chip including through electrodes penetrating the first semiconductor chip between a first active surface and a first non-active surface that is opposite to the first active surface, the first semiconductor chip mounted on a package substrate in a face-down state in which the first active surface faces the package substrate, a second semiconductor chip including a second active surface on which connection terminals are provided that electrically connect to the through electrodes, and a second non-active surface that is opposite to the second active surface, the second semiconductor chip stacked on the first semiconductor chip in a face-down state in which the second active surface faces the first non-active surface, and an integral adhesive structure provided on the package substrate to fix the first and second semiconductor chips. The integral adhesive structure may include an extension that protrudes from outer sidewalls of the first and second semiconductor chips to cover at least a pair of sidewalls of the first semiconductor chip. A top surface of the extension may be disposed at a lower level than the second non-active surface.

In an embodiment, the integral adhesive structure may substantially fill a first space between the package substrate and the first semiconductor chip and a second space between the first and second semiconductor chips.

In an embodiment, the extension may have one continuously convex sidewall between a level of the first active surface and a level of the second non-active surface.

In an embodiment, the semiconductor package may further include a molding layer provided on the package substrate to mold the first and second semiconductor chips. The connection terminals may be spaced apart from the molding layer by the integral adhesive structure.

In still another aspect, a semiconductor package may include a stack structure mounted on a package substrate and including two or more semiconductor chips sequentially stacked, and an integral adhesive structure substantially filling a first space between the package substrate and the stack structure and second spaces between the semiconductor chips. The integral adhesive structure may include an extension protruding from an outer sidewall of the stack structure. The extension may cover at least one sidewall of the stack structure. The extension may have one continuously convex sidewall between a level of a bottom surface of the stack structure and a level of a top surface of the stack structure.

In an embodiment, the semiconductor chips may have the substantially same planar shape and the substantially same planar size, and the extension may surround sidewalls of the stack structure.

In an embodiment, the semiconductor chips may be memory chips.

In an embodiment, the extension may include a first sub-extension and a second sub-extension on the first sub-extension. The first sub-extension may have one first continuously convex sidewall between a level of a top surface of the package substrate and a level of a top surface of a lowermost semiconductor chip of the stack structure, and the second sub-extension may have one second continuously convex sidewall between the level of the top surface of the lowermost semiconductor chip of the stack structure and the level of the top surface of the stack structure.

In an embodiment, the stack structure may further include through electrodes penetrating the semiconductor chips, and connection terminals provided between the semiconductor chips so as to be vertically aligned with the through electrodes. The adhesive structure may fill a space between the connection terminals to electrically insulate the connection terminals from each other.

In yet another aspect, a method to fabricate a semiconductor package may include compressively stacking a first semiconductor chip having a bottom surface covered with a first non-conductive film on a package substrate, compressively stacking a second semiconductor chip having a bottom surface covered with a second non-conductive film on the first semiconductor chip, and forming an integral adhesive structure that substantially fills a first space between the package substrate and the first semiconductor chip and a second space between the first and second semiconductor chips by thermally compressing the first and second non-conductive films when the second semiconductor chip is stacked. The integral adhesive structure may include an extension protruding from outer sidewalls of the first and second semiconductor chips by thermally compressing the first and second non-conductive films. The extension may have one continuously convex sidewall between a level of the bottom surface of the first semiconductor chip and a level of a top surface of the second semiconductor chip.

In an embodiment, compressively stacking the first semiconductor chip may be performed at a temperature that is lower than a hardening temperature of the first non-conductive film.

In an embodiment, compressively stacking the first semiconductor chip may be performed at a temperature of about 40 degrees Celsius to about 100 degrees Celsius.

In an embodiment, forming the adhesive structure may include thermally compressing the first and second non-conductive films at a temperature that is greater than a hardening temperature of the first and second non-conductive films to harden the first and second non-conductive films.

In an embodiment, the method may further include compressively stacking a third semiconductor chip having a bottom surface covered with a third non-conductive film on the package substrate before compressively stacking the first semiconductor chip. The first semiconductor chip may be stacked on the third semiconductor chip.

In an embodiment, the first to third non-conductive films may be thermally compressed to form the integral adhesive structure when the second semiconductor chip is stacked. The integral adhesive structure may also fill a third space between the package substrate and the third semiconductor chip, and the first space may be a space between the first and third semiconductor chips.

In an embodiment, the method may further include forming a preliminary adhesive structure by thermally compressing the third non-conductive film when the third semiconductor chip is stacked. The integral adhesive structure may be formed by hardening the preliminary adhesive structure and the first and second non-conductive films together.

In another aspect, a semiconductor package may comprise a plurality of semiconductor chips stacked on each other with a space between each semiconductor chip in which each semiconductor chip includes a top surface, a bottom surface and a pair of sidewalls, each top surface is opposite a corresponding bottom surface and each pair of sidewall is opposite each other and extending between a corresponding top surface and bottom surface; and an integral adhesive structure substantially continuously filling each space between the stacked semiconductor chips and substantially continuously covering at least one pair of sidewalls of at least one semiconductor chip that is adjacent to at least one space between the stacked semiconductor chips. In an embodiment, a portion of the integral adhesive structure substantially continuously covering the at least one pair of sidewalls of the at least one semiconductor chip comprises a substantially convex sidewall surface that extends outwardly from the at least one pair of sidewalls.

In another aspect, a method to fabricate a semiconductor package may include forming a stack of a plurality of semiconductor chips, the plurality of semiconductor chips being stacked on each other with a space between each semiconductor chip, each semiconductor chip including a top surface, a bottom surface and a pair of sidewalls, each top surface being opposite a corresponding bottom surface and each pair of sidewall being opposite each other and extending between a corresponding top surface and bottom surface; and forming an integral adhesive structure that substantially continuously fills each space between the stacked semiconductor chips and substantially continuously covers at least one pair of sidewalls of at least one semiconductor chip that is adjacent to at least one space between the stacked semiconductor chips. In an embodiment, a portion of the integral adhesive structure substantially continuously covering the at least one pair of sidewalls of the at least one semiconductor chip comprises a substantially convex sidewall surface that extends outwardly from the at least one pair of sidewalls.

BRIEF DESCRIPTION OF THE DRAWINGS

The subject matter disclosed herein will become more apparent in view of the attached drawings and accompanying detailed description.

DETAILED DESCRIPTION OF THE EMBODIMENTS

Figure 1A:
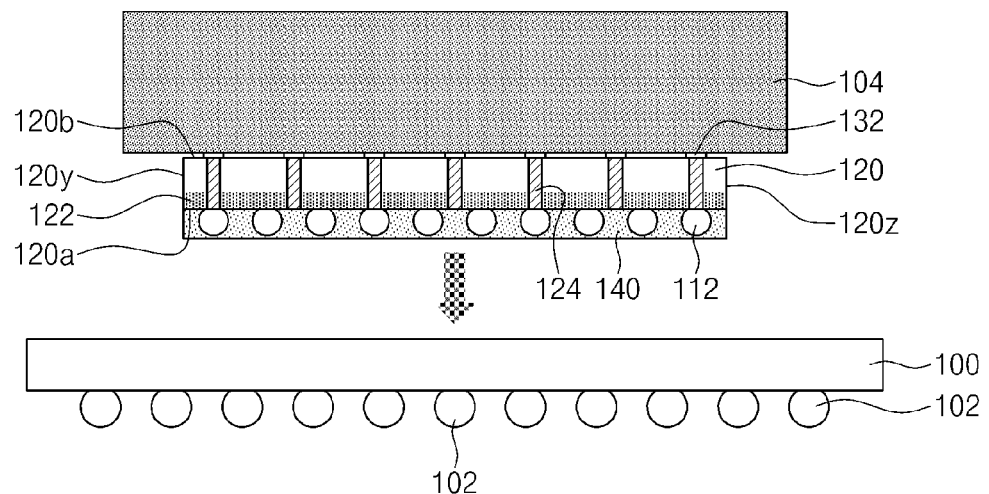
FIGS. 1A to 1F are cross-sectional views illustrating a method for fabricating a semiconductor package according to an embodiment disclosed herein.

The subject matter disclosed herein will now be described more fully hereinafter with reference to the accompanying drawings, in which exemplary embodiments are shown. The advantages and features of the concepts and methods of achieving them will be apparent from the following exemplary embodiments that will be described in more detail with reference to the accompanying drawings. It should be noted, however, that the subject matter disclosed herein is not limited to the following exemplary embodiments, and may be implemented in various forms. Accordingly, the exemplary embodiments are provided only to disclose the subject matter and to let those skilled in the art know the category of the subject matter. In the drawings, embodiments disclosed herein are not limited to the specific examples provided and may be exaggerated for clarity. As used herein, the term "and/or" includes any and all combinations of one or more of the associated listed items.

Additionally, it will be understood that when an element such as a layer, region or substrate is referred to as being "on" another element, it may be directly on the other element or intervening elements may be present. In contrast, the term "directly" means that there are no intervening elements. The same reference numerals or the same reference designators denote the same elements throughout the specification.

Moreover, exemplary embodiments are described herein with reference to cross-sectional views and/or plan views that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein, but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments. In the drawings, the thicknesses of layers and regions may be exaggerated for clarity. It will be also understood that although the terms first, second, third and so on may be used herein to describe various elements, these elements should not be limited by these terms. These terms are only used to distinguish one element from another element. Thus, a first element in some embodiments could be termed a second element in other embodiments without departing from the scope of the claimed subject matter. Exemplary embodiments disclosed herein explained and illustrated herein include their complementary counterparts.

The terminology used herein is for the purpose of describing particular embodiments only and is not intended to limit the claimed subject matter. As used herein, the singular terms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

FIGS. 1A to 1D are cross-sectional views illustrating a method for fabricating a semiconductor package according to an embodiment disclosed herein. FIG. 2A is a plan view illustrating a portion of a first semiconductor chip of FIG. 1A. FIG. 2B is a plan view illustrating a portion of a second semiconductor chip of FIG. 1B. FIG. 2C is a plan view illustrating a portion of FIGS. 1C and 1D.

Figure 1B:
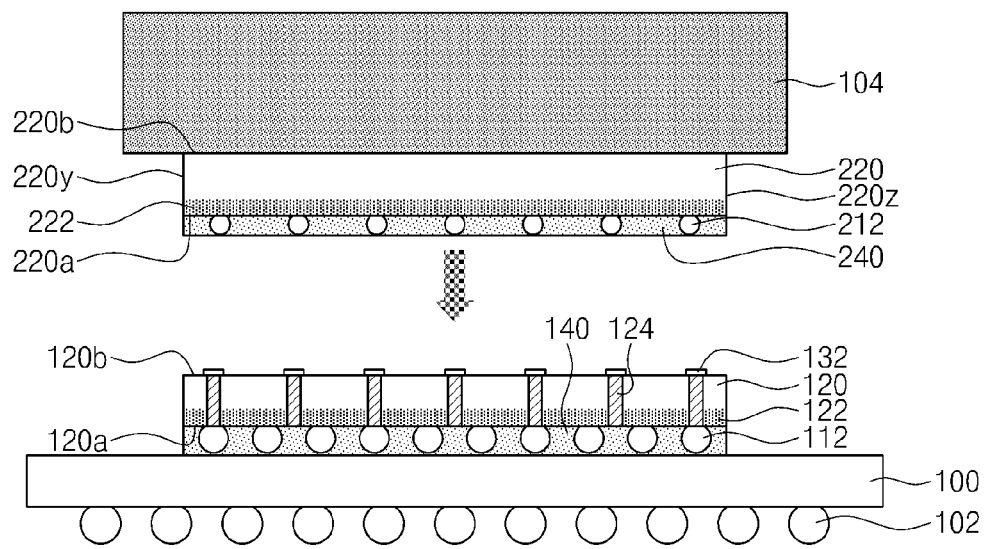
Figure 2A:
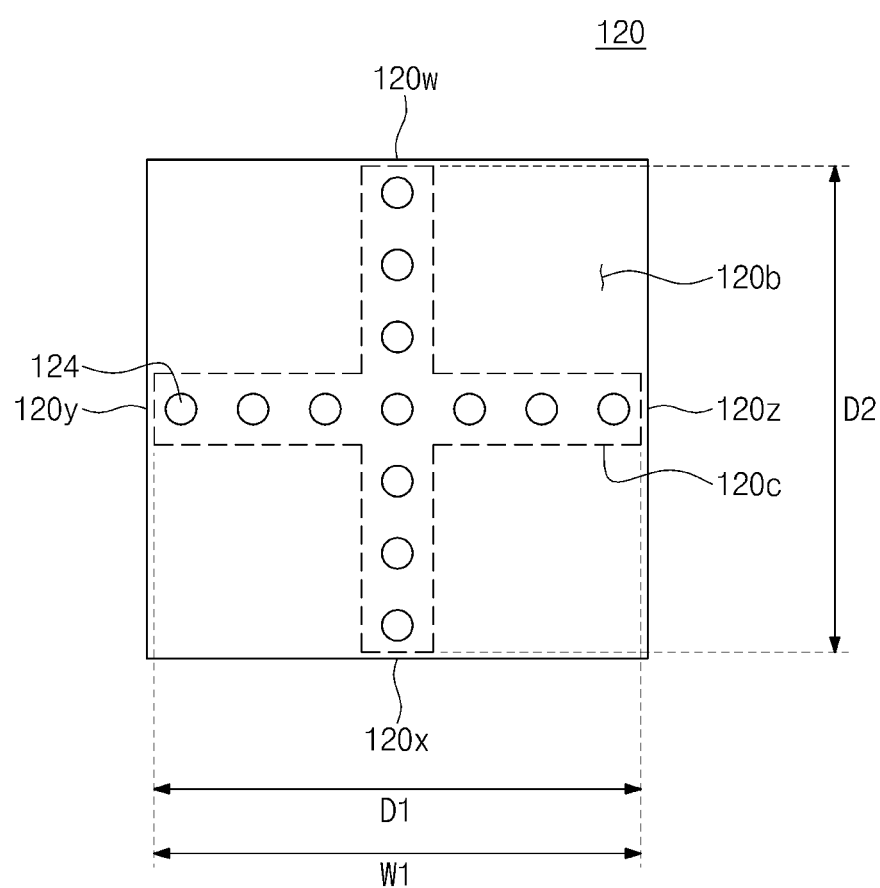
FIG. 2A is a plan view illustrating a portion of a first semiconductor chip of FIG. 1A.
Figure 2B:
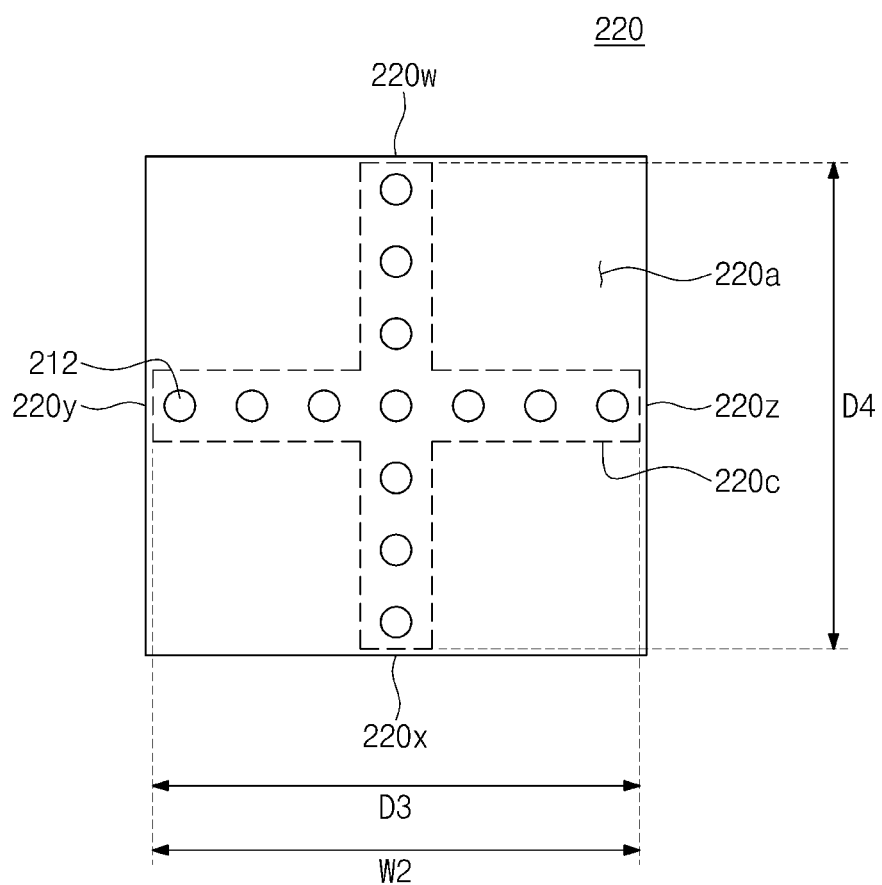
FIG. 2B is a plan view illustrating a portion of a second semiconductor chip of FIG. 1B.
Figure 2C:
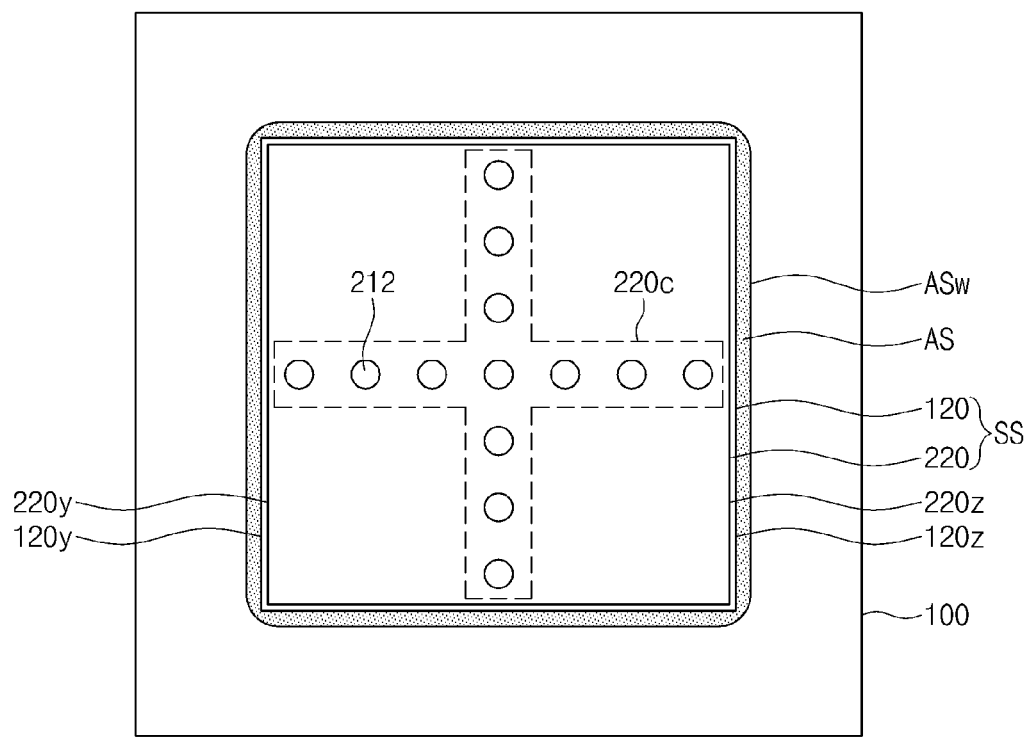
FIG. 2C is a plan view illustrating a portion of FIGS. 1C and 1D.

Referring to FIGS. 1A and 1B, a first semiconductor chip 120 may be mounted on a package substrate 100. For example, the package substrate 100 may be a printed circuit board (PCB). External terminals 102 (e.g., solder balls) may be bonded to a bottom surface of the package substrate 100.

The first semiconductor chip 120 may include a first active surface 120a and a first non-active surface 120b that is opposite to the first active surface 120a. A first circuit layer 122 is formed on the first active surface 120a. In an embodiment, the first semiconductor chip 120 may be a memory chip. The first semiconductor chip 120 may include first through electrodes 124 that penetrate the first semiconductor chip 120 to be electrically connected to the first circuit layer 122. For example, each of the first through electrodes 124 may be a through-silicon via (TSV). The first through electrodes 124 may be concentrated in a first central region 120c of the first semiconductor chip 120, as illustrated in FIG. 2A. In an embodiment, the first central region 120c may have a cross shape. Accordingly, in the first circuit layer 122, the first central region 120c may correspond to a peripheral circuit region, and other regions except the first central region 120c may correspond to memory cell regions.

As illustrated in FIG. 2A, the first semiconductor chip 120 may include first to fourth sidewalls 120y, 120z, 120w and 120x. The first semiconductor chip 120 may have a first width W1. In other words, at least one of a distance D1 between the first and second sidewalls 120y and 120z that are opposite to each other and a distance D2 between the third and fourth sidewalls 120w and 120x that are opposite to each other may be equal to or substantially equal to the first width W1. In an embodiment, the distance D1 between the first and second sidewalls 120y and 120z and the distance D2 between the third and fourth sidewalls 120w and 120x may be equal to or substantially equal to the first width.

First connection terminals 112 (e.g., solder balls or solder bumps) may be provided on the first active surface 120a of the first semiconductor chip 120. The first semiconductor chip 120 may be electrically connected to the package substrate 100 through the first connection terminals 112. First backside pads 132 may be provided on the first non-active surface 120b of the first semiconductor chip 120 to be electrically connected to the first through electrodes 124.

According to the present embodiment, a first non-conductive film 140 may be adhered to the first active surface 120a of the first semiconductor chip 120. The first non-conductive film 140 may be an epoxy-based adhesive film. In an embodiment, the first non-conductive film 140 may be hardened at a temperature greater than about 100 degrees Celsius. Before the first non-conductive film 140 is thermally compressed, the first non-conductive film 140 may have a thickness equal to or greater than a protruding length of the first connection terminals 112 from the first semiconductor chip 120. In other words, the first non-conductive film 140 may cover the first connection terminals 112 and may completely fill a space between the first connection terminals 112.

Referring to FIGS. 1B and 2B, the first semiconductor chip 120 may be stacked (i.e., mounted) on the package substrate 100 in a face-down state in which the first active surface 120a faces the package substrate 100. In detail, as illustrated in FIG. 1A, the first semiconductor chip 120 may be coupled to a bottom surface of a head 104, and the first semiconductor chip 120 may be provided on the package substrate 100 by the head 104.

According to the present embodiment, stacking the first semiconductor chip 120 on the package substrate 100 may be performed at a temperature lower than the hardening temperature of the first non-conductive film 140. In detail, stacking the first semiconductor chip 120 on the package substrate 100 may be performed at the temperature of about 40 degrees Celsius to about 100 degrees Celsius. Additionally, when the first semiconductor chip 120 is stacked, the head 104 may apply a small force ranging from about 4N to about 8N to the first semiconductor chip 120 for a short time. Thus, the first non-conductive film 140 may be disposed between the first semiconductor chip 120 and the package substrate 100.

Next, a second semiconductor chip 220 may be stacked on the first semiconductor chip 120. The second semiconductor chip 220 may include a second active surface 220a and a second non-active surface 220b that are opposite to the second active surface 220a. A second circuit layer 222 may be formed on the second active surface 220a. For example, the second semiconductor chip 220 may be a memory chip. The second semiconductor chip 220 may include second connection terminals 212 (e.g., solder balls or solder bumps) that are provided on the second active surface 220a to be electrically connected to the second circuit layer 222.

The second connection terminals 212 may be concentrated in a second central region 220c of the second active surface 220a of the second semiconductor chip 220, as illustrated in FIG. 2B. In an embodiment, the second central region 220c may have a cross shape. Accordingly, in the second circuit layer 222, the second central region 220c may correspond to a peripheral circuit region, and other regions except the second central region 220c may correspond to memory cell regions. The second connection terminals 212 may be vertically aligned with the first through electrodes 124. In the present embodiment, the second semiconductor chip 220 may not include a through electrode, unlike the first semiconductor chip 120. However, the claimed subject matter is not limited thereto.

As illustrated in FIG. 2B, the second semiconductor chip 220 may include fifth to eighth sidewalls 220y, 220z, 220w and 220x. The second semiconductor chip 220 may have a second width W2. In other words, at least one of a distance D3 between the fifth and sixth sidewalls 220y and 220z that are opposite to each other and a distance D4 between the seventh and eighth sidewalls 220w and 220x that are opposite to each other may be equal to or substantially equal to the second width W2. In an embodiment, the distance D3 between the fifth and sixth sidewalls 220y and 220z and the distance D4 between the seventh and eighth sidewalls 220w and 220x may be equal to or substantially equal to the second width W2. Here, the second width W2 may be substantially equal to the first width W1 of the first semiconductor chip 120.

According to the present embodiment, a second non-conductive film 240 may be adhered to the second active surface 220a of the second semiconductor chip 220. The second non-conductive film 240 may be an epoxy-based adhesive film. The second non-conductive film 240 may include the same material as the first non-conductive film

140. Before the second non-conductive film 240 is thermally compressed, the second non-conductive film 240 may have a thickness equal to or greater than a protruding length of the second connection terminals 212 from the second semiconductor chip 220. In other words, the second non-conductive film 240 may cover the second connection terminals 212 and may completely fill a space between the second connection terminals 212. Meanwhile, sizes of the second connection terminals 212 may be smaller than those of the first connection terminals 112, and thus, the thickness of the second non-conductive film 240 may be less than that of the first non-conductive film 140.

Figure 1C:
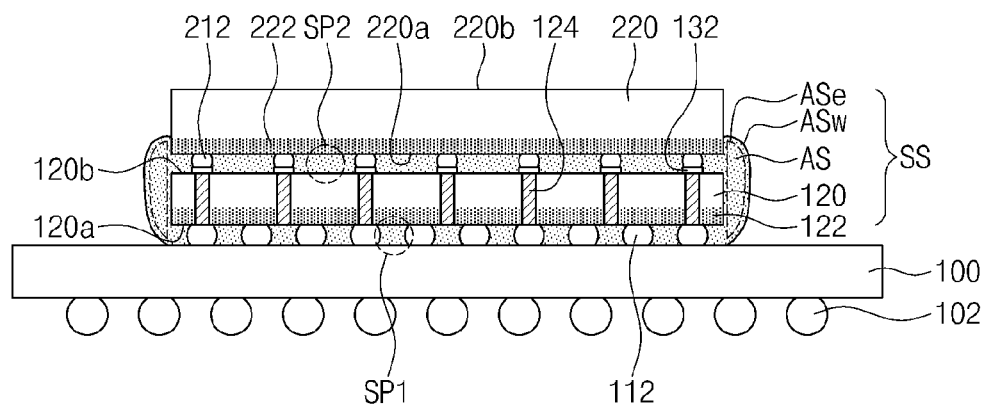

Referring to FIGS. 1C and 2C, the second semiconductor chip 220 may be stacked on the first semiconductor chip 120 in a face-down state in which the second active surface 220a faces the first semiconductor chip 120. In detail, as illustrated in FIG. 1B, the second semiconductor chip 220 may be coupled to the bottom surface of the head 104, and the second semiconductor chip 220 may be provided on the first semiconductor chip 120 by the head 104. Thus, the second active surface 220a of the second semiconductor chip 220 may face the first non-active surface 120b of the first semiconductor chip 120. The first and second semiconductor chips 120 and 220 may form a stack structure SS, and the stack structure SS may be mounted on the package substrate 100.

According to the present embodiment, when the second semiconductor chip 220 is stacked on the first semiconductor chip 120, all of the first and second non-conductive films 140 and 240 may be thermally compressed to form an adhesive structure AS. The adhesive structure AS may be an integral body, or structure, and may substantially fill a first space SP1 between the package substrate 100 and the first semiconductor chip 120 and a second space SP2 between the first and second semiconductor chips 120 and 220. For example, the adhesive structure AS may be an integral body, or structure, and may substantially continuously fill a first space SP1 between the package substrate 100 and the first semiconductor chip 120 and a second space SP2 between the first and second semiconductor chips 120 and 220.

In detail, a strong force may be applied to the second semiconductor chip 220 by the head 104 at a temperature greater than the hardening temperature of the first and second non-conductive films 140 and 240, thereby thermally compressing the first and second non-conductive films 140 and 240. In an embodiment, during the thermal compression process, a force of about 10N to about 30N may be applied to the second semiconductor chip 220 at a temperature of about 200 degrees Celsius to about 350 degrees Celsius.

Thus, the first and second non-conductive films 140 and 240 may be compressed so the second connection terminals 212 may come in contact with the first backside pads 132 and the first connection terminals 112 may come in contact with the package substrate 100. As a result, the package substrate 100 and the first and second semiconductor chips 120 and 240 may be electrically connected to each other. Additionally, the first and second non-conductive films 140 and 240 may be thinned by the thermal compression process to form an extension ASe protruding outward from outer sidewalls (e.g., the first to eighth sidewalls) of the first and second semiconductor chips 120 and 220. During the thermal compression process, protruding portions of the first and second non-conductive films 140 and 240 may be hardened in one integral body or structure to form the extension ASe.

The adhesive structure AS may include the extension ASe. Since the adhesive structure AS is formed by thermally compressing the first and second non-conductive films 140 and 240 at the same time, the extension ASe may have one continuous sidewall ASw. In an embodiment, the extension ASe may have the one sidewall ASw that is continuous and convex between a level of the first active surface 120a and a level of the second non-active surface 220b. The extension ASe may completely cover at least a pair of sidewalls 120y and 120z that are opposite to each other of the first semiconductor chip 120. The extension ASe may cover portions of at least a pair of sidewalls 220y and 220z that are opposite to each other of the second semiconductor chip 220. In other words, a top surface of the extension ASe may be disposed at a lower level than the second non-active surface 220b. Additionally, the extension ASe may be in direct contact with a top surface of the package substrate 100.

In the method for fabricating the semiconductor package according to the present embodiment, since the first and second semiconductor chips 120 and 220 are stacked on and bonded to the package substrate 100 by the first and second non-conductive films 140 and 240, the first and second connection terminals 112 and 212 may have fine pitches without electrical shorts between the first connection terminals 112 and between the second connection terminals 212. Additionally, since the second connection terminals 212 are in direct contact with the first backside pads 132, contact resistances therebetween may be reduced or minimized. Moreover, since the first and second non-conductive films 140 and 240 act as an underfill filling the first space SP1 between the package substrate 100 and the first semiconductor chip 120 and an underfill filling the second space SP2 between the first and second semiconductor chips 120 and 220, mechanical endurance of the first and second connection terminals 112 and 212 may be improved.

Furthermore, when the first and second semiconductor chips 120 and 220 are stacked, the first and second non-conductive films 140 and 240 may not be thermally compressed independently of each other, but may be thermally compressed at the same time to be hardened. Thus, the process of stacking the semiconductor chips may be rapidly and effectively performed in comparison to a stacking process that including processes of independently thermally compressing the first and second non-conductive films 140 and 240. On the other hand, if the first and second non-conductive films 140 and 240 are thermally compressed independently, an extension ASe may be vertically grown such that a top surface of the extension ASe may be higher than the second non-active surface 220b. In this case, a releasing film between the head 104 and the second semiconductor chip 220 may be required to prevent the vertical growth of the extension ASe, and thus independent thermally compressing processes may be inefficient. The releasing film, however, may be omitted in the method for fabricating the semiconductor package according to the subject matter disclosed herein.

Figure 1D:
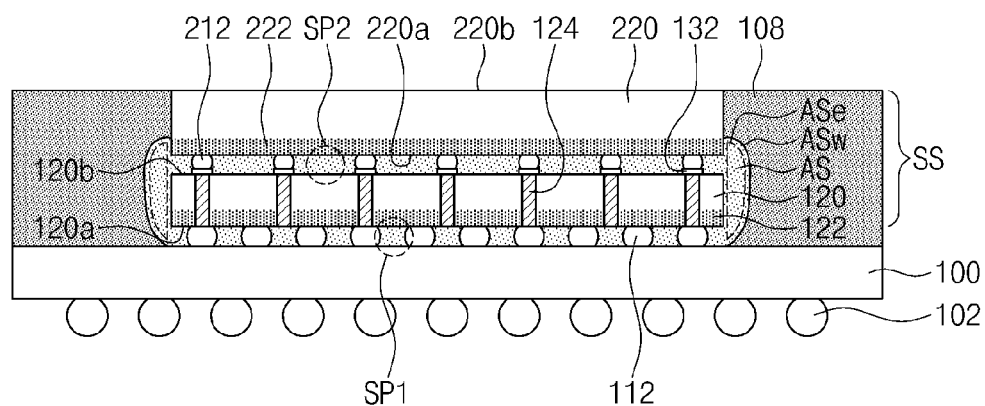

Referring to FIGS. 1D and 2C, a molding layer 108 may be formed on the package substrate 100 to mold the stack structure SS. As described above, since the adhesive structure AS acts as underfills filling the first and second spaces SP1 and SP2, the molding layer 108 may be easily formed without a molded underfill (MUF) process.

In an embodiment, the molding layer 108 may expose the second non-active surface 220b of the second semiconductor chip 220 so the second non-active surface 220b may be substantially coplanar with a top surface of the molding layer 108. Since the molding layer 108 exposes the second non-active surface 220b, heat generated from the first and second semiconductor chips 120 and 220 may be easily removed. In an embodiment, even though not shown in the drawings, the molding layer 108 may completely cover the second non-active surface 220b of the second semiconductor chip 220.

Hereinafter, the semiconductor package according to the present embodiment will be described with reference to FIGS. 1D and 2C.

Referring to FIGS. 1D and 2C, the stack structure SS may be mounted on the package substrate 100. For example, the package substrate 100 may be a printed circuit board (PCB). The external terminals 102 (e.g., solder balls) may be bonded to the bottom surface of the package substrate 100.

The stack structure SS may include the first semiconductor chip 120 and the second semiconductor chip 220 that are sequentially stacked. The first semiconductor chip 120 may include the first active surface 120a on which the first circuit layer 122 is formed, and the first non-active surface 120b that is opposite to the first active surface 120a. The second semiconductor chip 220 may include the second active surface 220a on which the second circuit layer 222 is formed, and the second non-active surface 220b that is opposite to the second active surface 220a. The first semiconductor chip 120 may include the first through electrodes 124, which penetrate the first semiconductor chip 120 to be electrically connected to the first circuit layer 122. The second semiconductor chip 220 may not include through electrodes, unlike the first semiconductor chip 120. The claimed subject matter, however, is not limited thereto. In the present embodiment, the first and second semiconductor chips 120 and 220 may be memory chips.

The first semiconductor chip 120 may have the first width W1, and the second semiconductor chip 220 may have the second width W2. In an embodiment, the first width W1 may be substantially equal to the second width W2. In other words, the first and second semiconductor chips 120 and 220 may have the substantially same planar shape or planar size. Thicknesses of the first and second semiconductor chips 120 and 220, however, may be different from each other. The claimed subject matter is not limited thereto.

The first connection terminals 112 (e.g., solder balls or solder bumps) may be provided on the first active surface 120a of the first semiconductor chip 120. The first semiconductor chip 120 may be electrically connected to the package substrate 100 through the first connection terminals 112. The first backside pads 132 may be provided on the first non-active surface 120b of the first semiconductor chip 120 to be electrically connected to the first through electrodes 124. The second semiconductor chip 220 may include the second connection terminals 212 (e.g., solder balls or solder bumps) that are provided on the second active surface 220a to be electrically connected to the second circuit layer 222.

The second connection terminals 212 may be electrically connected to the first through electrodes 124 through the first backside pads 132. Accordingly, the second connection terminals 212 may be vertically aligned with the first through electrodes 124. As a result, the package substrate 100 and the first and second semiconductor chips 120 and 220 may be vertically and electrically connected to each other.

According to the present embodiment, the adhesive structure AS that is in a single integral body, or structure, may be provided to substantially fill the first space SP1 between the package substrate 100 and the first semiconductor chip 120 and the second space SP2 between the first and second semiconductor chips 120 and 220. The adhesive structure AS may bond the stack structure SS to the package substrate 100. Additionally, the adhesive structure AS may fill the spaces between the first connections terminals 112 and between the second connection terminals 212 to insulate the first connection terminals 112 from each other and to insulate the second connection terminals 212 from each other. The adhesive structure AS may include the extension ASe protruding outward from the outer sidewalls of the first and second semiconductor chips 120 and 220.

The extension ASe may have at least one continuously convex sidewall ASw when viewed from a side cross-sectional view. The convex sidewall ASw may be disposed between the level of the first active surface 120a and the level of the second non-active surface 220b.

The extension ASe may completely cover at least a pair of opposite sidewalls 120y and 120z of the first semiconductor chip 120. The extension ASe may cover portions of at least a pair of opposite sidewalls 220y and 220z of the second semiconductor chip 220. In other words, the top surface of the extension ASe may be disposed at a lower level than the second non-active surface 220b. Additionally, the extension ASe may be in direct contact with the top surface of the package substrate 100.

The molding layer 108 molding the stack structure SS may be provided on the package substrate 100. In an embodiment, the molding layer 108 may expose the second non-active surface 220b of the second semiconductor chip 220 so the second non-active surface 220b may be substantially coplanar with the top surface of the molding layer 108. Since the molding layer 108 exposes the second non-active surface 220b, heat generated from the first and second semiconductor chips 120 and 220 may be easily removed. In an embodiment, even though not shown in the drawings, the molding layer 108 may completely cover the second non-active surface 220b of the second semiconductor chip 220.

Figure 1E:
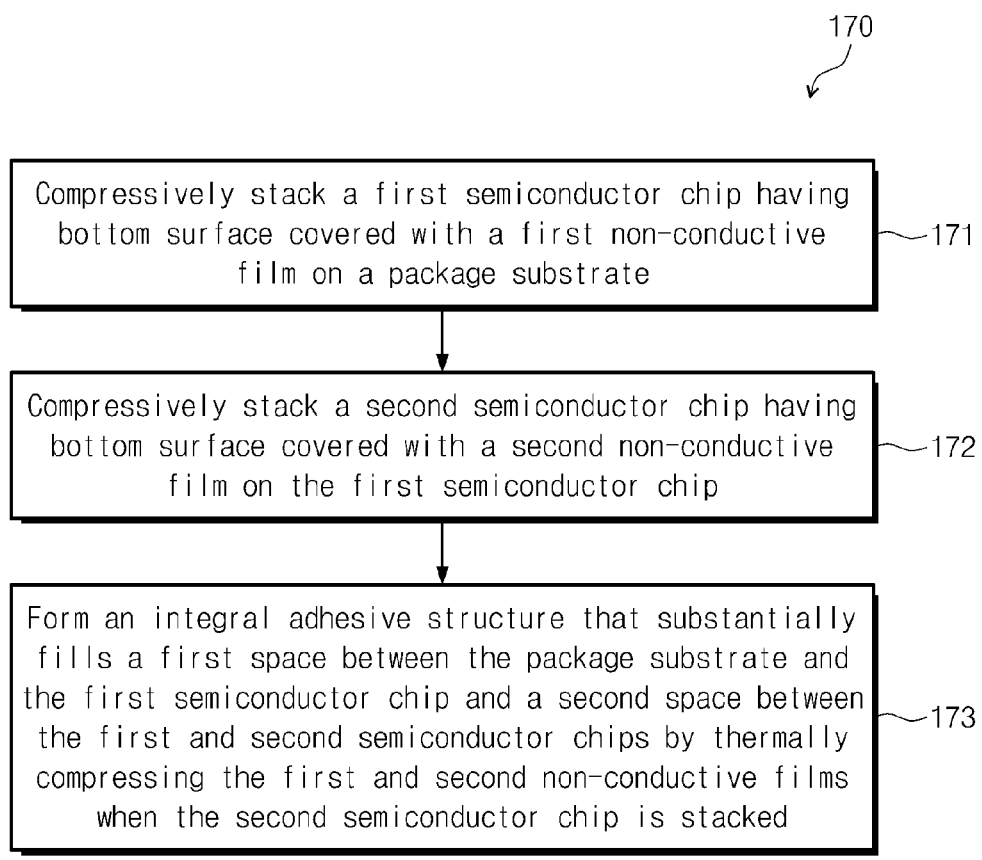

FIG. 1E is an embodiment of a method 170 to fabricate a semiconductor package according to the subject matter disclosed herein. At operation 171, a first semiconductor chip having a bottom surface covered with a first non-conductive film is compressively stacked on a package substrate. In one embodiment, compressively stacking the first semiconductor chip is performed at a temperature that is lower than a hardening temperature of the first non-conductive film. For example, compressively stacking the first semiconductor chip is performed at a temperature of about 40 degrees Celsius to about 100 degrees Celsius. At operation 172, a second semiconductor chip having a bottom surface covered with a second non-conductive film is compressively stacked on the first semiconductor chip. At operation 173, an integral adhesive structure that substantially continuously fills a first space between the package substrate and the first semiconductor chip and a second space between the first and second semiconductor chips is formed by thermally compressing the first and second non-conductive films when the second semiconductor chip is stacked. In one embodiment, the integral adhesive structure includes an extension protruding from outer sidewalls of the first and second semiconductor chips by thermally compressing the first and second non-conductive films, and the extension has one continuously convex sidewall between a level of the bottom surface of the first semiconductor chip and a level of a top surface of the second semiconductor chip. In one embodiment, forming the adhesive structure comprises: thermally compressing the first and second non-conductive films at a temperature greater than a hardening temperature of the first and second non-conductive films to harden the first and second non-conductive films. In an alternative embodiment, a third semiconductor chip having a bottom surface covered with a third non-conductive film may be compressively stacked on the package substrate before compressively stacking the first semiconductor chip, then the first semiconductor chip is stacked on the third semiconductor chip. In this alternative embodiment, the first to third non-conductive films may be thermally compressed to form the adhesive structure when the second semiconductor chip is stacked. The adhesive structure further substantially continuously fills a third space between the package substrate and the third semiconductor chip in which the first space is a space between the first and third semiconductor chips. In yet another alternative embodiment, a preliminary adhesive structure may be formed by thermally compressing the third non-conductive film when the third semiconductor chip is stacked in which the integral adhesive structure is formed by hardening the preliminary adhesive structure and the first and second non-conductive films together.

Figure 1F:
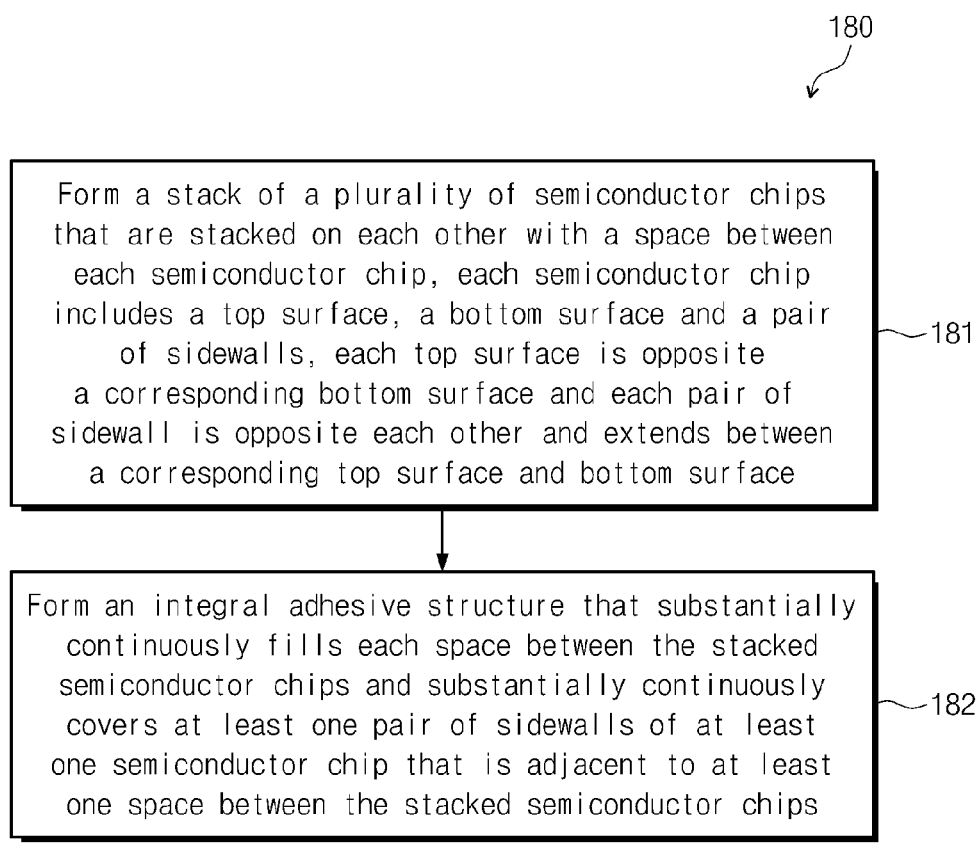

FIG. 1F is an embodiment of another method 180 to fabricate a semiconductor package. At operation 181, a stack of a plurality of semiconductor chips is formed in which the plurality of semiconductor chips are stacked on each other with a space between each semiconductor chip, each semiconductor chip includes a top surface, a bottom surface and a pair of sidewalls, each top surface is opposite a corresponding bottom surface and each pair of sidewall is opposite each other and extending between a corresponding top surface and bottom surface. At operation 182, an integral adhesive structure is formed that substantially continuously fills each space between the stacked semiconductor chips and substantially continuously covers at least one pair of sidewalls of at least one semiconductor chip that is adjacent to at least one space between the stacked semiconductor chips. In one embodiment, a portion of the integral adhesive structure substantially continuously covering the at least one pair of sidewalls of the at least one semiconductor chip may include a substantially convex sidewall surface that extends outwardly from the at least one pair of sidewalls. In another embodiment, the integral adhesive structure may extend from a bottom surface of a bottom semiconductor chip of the plurality of semiconductor chips to a top surface of a top semiconductor chip of the plurality of semiconductor chips. In one embodiment, at least one semiconductor chip of the plurality of semiconductors chips may include at least one through via extending from the top surface of the semiconductor chip to the bottom surface of the semiconductor chip. In one embodiment, at least one semiconductor chip may comprise a plurality of through vias extending from the top surface of the semiconductor chip to the bottom surface of the semiconductor chip in which the plurality of through vias are arranged in substantially a cross pattern across the top and bottom surfaces of the semiconductor chip. In one embodiment, the stack of the plurality of semiconductor chips may be formed on a package substrate. In one embodiment, the integral adhesive structure is non-conductive. In one embodiment, at least one of the plurality of semiconductor chips comprises a memory semiconductor chip. In another embodiment, at least one of the plurality of semiconductor chips comprises an application controller. In still another embodiment, a molding layer may be formed that substantially surrounding the stack of the plurality of semiconductor chips.

Figure 3:
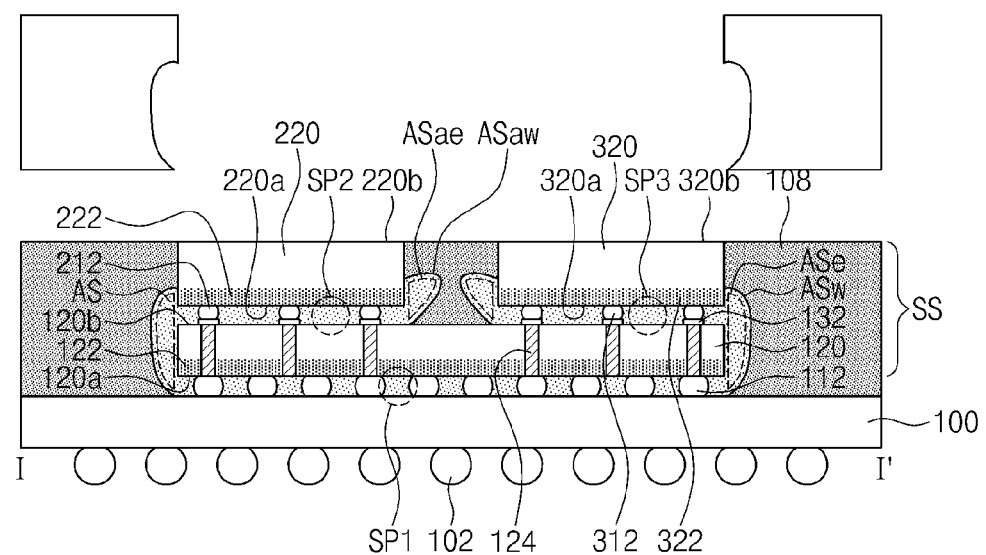
FIG. 3 is a cross-sectional view illustrating a semiconductor package according to an embodiment disclosed herein.
Figure 4:
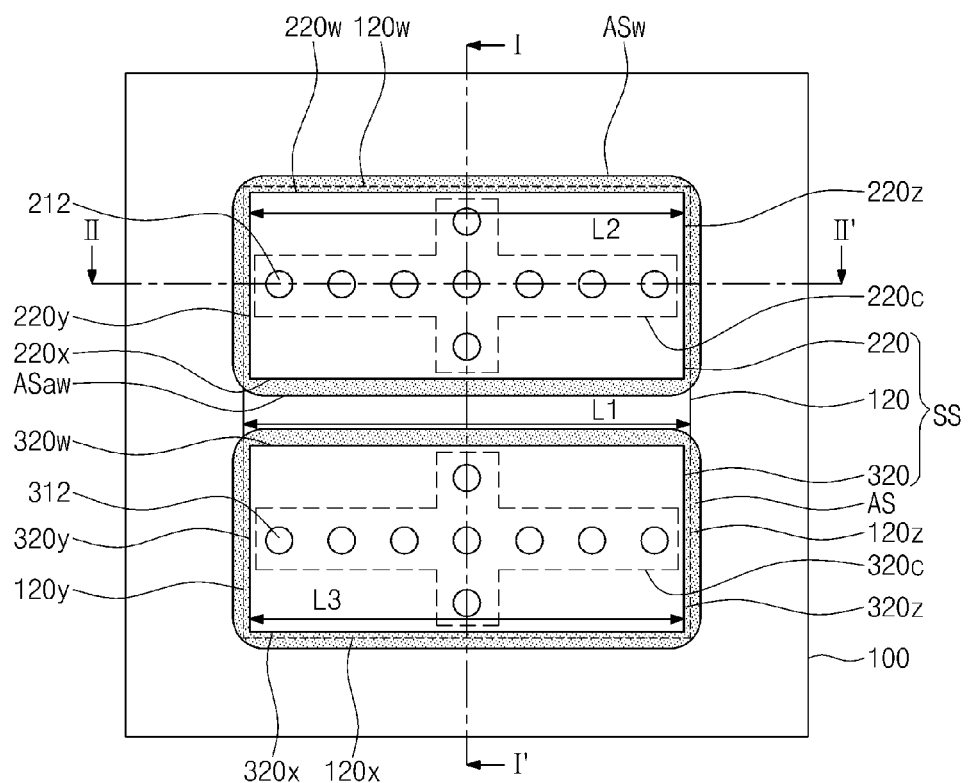
FIG. 4 is a plan view illustrating a portion of FIG. 3.

FIG. 3 is a cross-sectional view illustrating a semiconductor package according to an embodiment disclosed herein. FIG. 4 is a plan view illustrating a portion of FIG. 3. In detail, FIG. 3 is a cross-sectional view taken along a line I-I' of FIG. 4, and a cross-sectional view taken along a line II-II' of FIG. 4 may be the same as the cross-sectional view of FIG. 1D. In the present embodiment, the descriptions to the same elements as in the embodiment of FIGS. 1A to 1D and 2A to 2C will be omitted or mentioned briefly for the purpose of ease and convenience in explanation. In other words, differences between the present embodiment and the above embodiment will be primarily described hereinafter.

Referring to FIGS. 3 and 4, a stack structure SS may be mounted on a package substrate 100. The stack structure SS may include a first semiconductor chip 120, and second and third semiconductor chips 220 and 320 stacked on the first semiconductor chip 120. The second and third semiconductor chips 220 and 320 may be spaced apart from each other on the first semiconductor chip 120. In an embodiment, the second and third semiconductor chips 220 and 320 may be laterally spaced apart from each other. In an embodiment, the third semiconductor chip 320 may include a central region 320c that has a cross shape. In the present embodiment, the first semiconductor chip 120 may be a non-memory chip, such as an application processor, and the second and third semiconductor chips 220 and 320 may be memory chips. In an alternative embodiment, all of the first to third semiconductor chips 120, 220 and 320 may be memory chips.

A distance between at least a pair of opposite sidewalls 120y and 120z of the first semiconductor chip 120 may be defined as a first distance L1. A distance between at least a pair of opposite sidewalls 220y and 220z of the second semiconductor chip 220 may be defined as a second distance L2, and a distance between at least a pair of opposite sidewalls 320y and 320z of the third semiconductor chip 320 may be defined as a third distance L3. In this instance, the first to third distances L1 to L3 may be substantially equal to each other. Thus, even though the second and third semiconductor chips 220 and 320 having different sizes from the first semiconductor chip 120 are stacked on the first semiconductor chip 120 in a semiconductor package according to the present embodiment, a cross-sectional view taken along one direction (e.g., the line II-II' of FIG. 4), of the semiconductor package may be the same as the cross-sectional view of FIG. 1D.

The third semiconductor chip 320 may have a third active surface 320a on which a third circuit layer 322 is formed, and a third non-active surface 320b that is opposite to the third active surface 320a. The third semiconductor chip 320 may include third connection terminals 312 (e.g., solder balls or solder bumps) that are provided on the third active surface 320a to be electrically connected to the third circuit layer 322. The third connection terminals 312 may be electrically connected to first through electrodes 124 through first backside pads 132 of the first semiconductor chip 120. Second connection terminals 212 and the third connection terminals 312 may be vertically aligned with the first through electrodes 124. As a result, the package substrate 100 and the first to third semiconductor chips 120, 220 and 320 may be vertically and electrically connected to each other.

According to the present embodiment, an adhesive structure AS in one integral body, or structure, may be provided to substantially continuously fill a first space SP1 between the package substrate 100 and the first semiconductor chip 120, a second space SP2 between the first and second semiconductor chips 120 and 220, and a third space SP3 between the first and third semiconductor chips 120 and 320. For example, According to the present embodiment, an adhesive structure AS in one integral body, or structure, may be provided to substantially continuously fill a first space SP1 between the package substrate 100 and the first semiconductor chip 120, a second space SP2 between the first and second semiconductor chips 120 and 220, and a third space SP3 between the first and third semiconductor chips 120 and 320. The adhesive structure AS may include an extension ASe and a sub-extension ASae that protrude outward from outer sidewalls of the second and third semiconductor chips 220 and 320.

In detail, the extension ASe may cover a pair of sidewalls 120y and 120z of the first semiconductor chip 120 when viewed from a cross-sectional view (e.g., taken along the line I-I' of FIG. 4). The sub-extension ASae may be provided on the first semiconductor chip 120 between the second and third semiconductor chips 220 and 320.

The extension ASe may have at least one first continuously convex sidewall ASw. The first convex sidewall ASw may be disposed between a level of the first active surface 120a and a level of the second or third non-active surface 220b or 320b. The sub-extension ASae may have at least one second continuously convex sidewall ASaw. The second convex sidewall ASaw may be disposed between a level of the first non-active surface 120b and a level of the second or third non-active surface 220b or 320b.

In an embodiment, the sub-extension ASae adjacent to the second semiconductor chip 220 may be formed from the second non-conductive film 240 of FIG. 1B when the non-conductive films are thermally compressed at the same time, as described above. In other words, after the thermal compression process, the sub-extension ASae may correspond to a portion of the second non-conductive film 240 that protrudes into a space between the second and third semiconductor chips 220 and 320 and is hardened independently of the first non-conductive film 140. The sub-extension ASae adjacent to the third semiconductor chip 320 may be formed by the same method as the sub-extension ASae adjacent to the second semiconductor chip 220.

A molding layer 108 molding the stack structure SS may be provided on the package substrate 100. In an embodiment, the molding layer 108 may expose the second non-active surface 220b of the second semiconductor chip 220 and the third non-active surface 320b of the third semiconductor chip 320.

In an embodiment, the adhesive structure AS having the extension ASe may be formed in a case that the semiconductor chips having different sizes and different widths from each other are stacked on the package substrate 100. In other words, when one-sidewalls of the semiconductor chips are aligned with each other, the extension ASe may be formed on the one-sidewalls. For example, as illustrated in FIGS. 3 and 4, when sidewalls 120w and 220w of the first and second semiconductor chips 120 and 220 are aligned with each other and sidewalls 120x and 320x of the first and third semiconductor chips 120 and 320 are aligned with each other, the extension ASe may be formed on the sidewalls 120w, 220w, 120x and 320x. Additionally, the sub-extension ASae may be formed on the sidewalls 220x and 320w, as shown in FIG. 3.

Figure 5A:
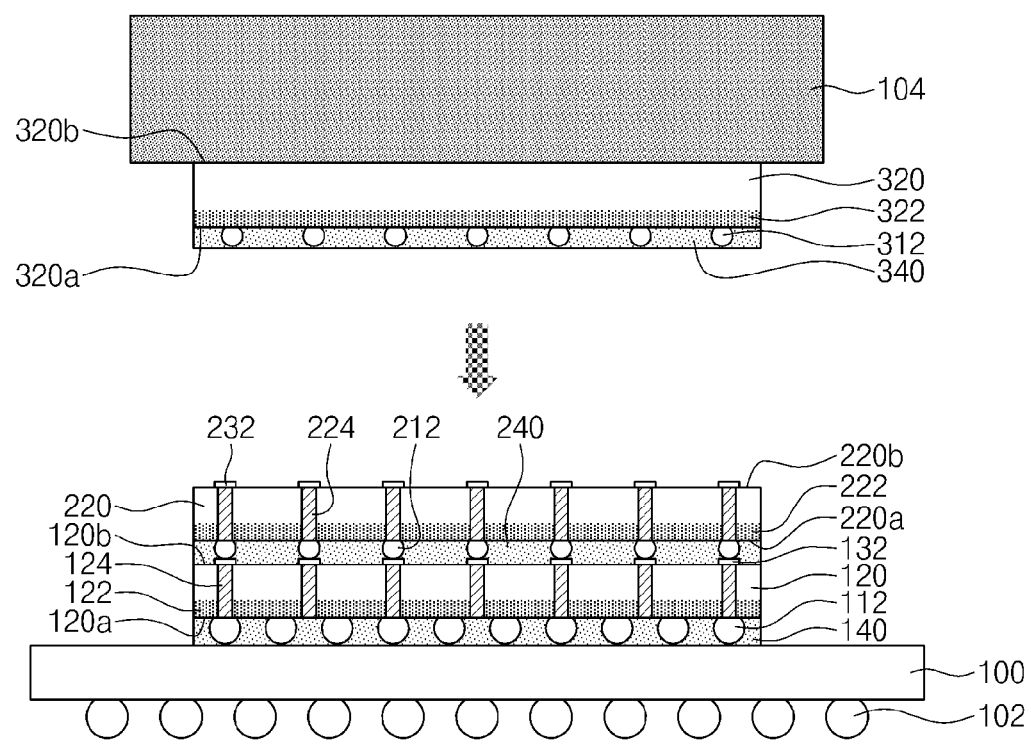
FIGS. 5A and 5B are cross-sectional views illustrating a method for fabricating a semiconductor package according to an embodiment disclosed herein.
Figure 5B:
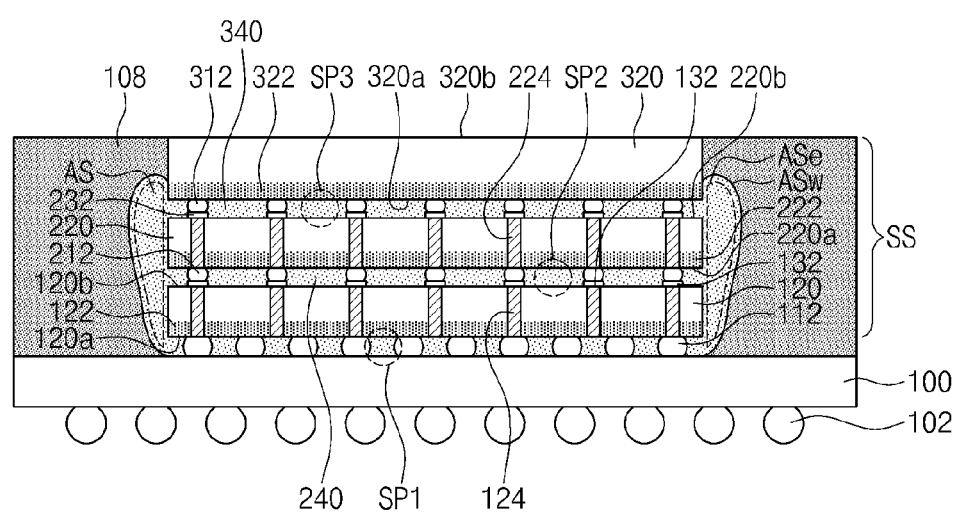
Figure 6:
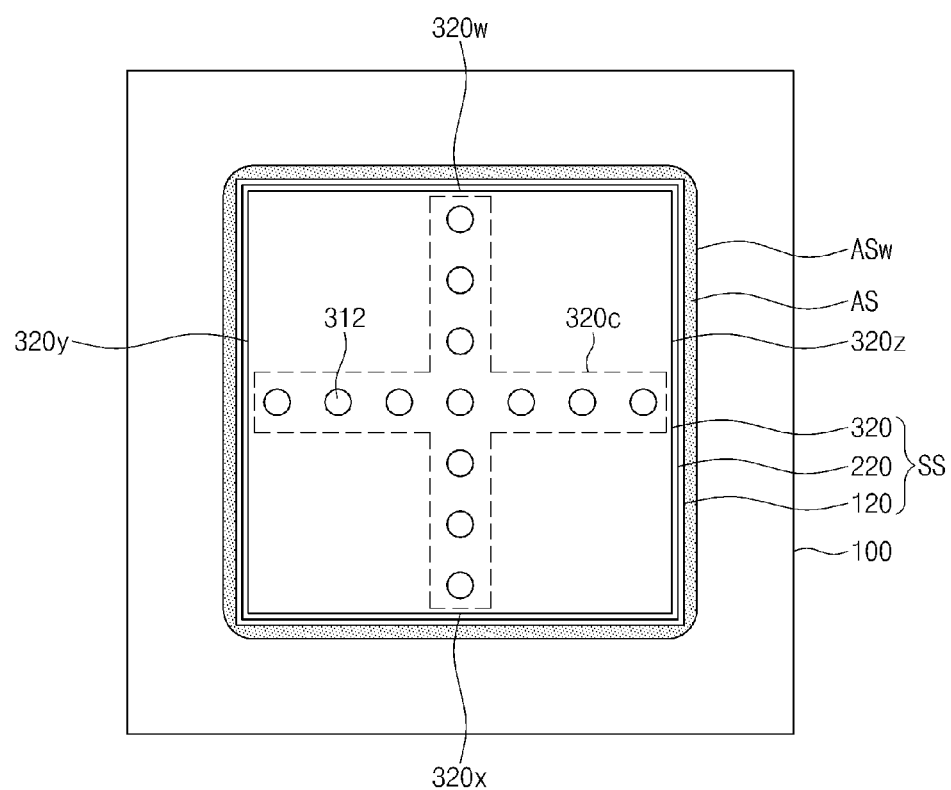
FIG. 6 is a plan view illustrating a portion of FIG. 5B.

FIGS. 5A and 5B are cross-sectional views illustrating a method for fabricating a semiconductor package according to an embodiment disclosed herein. FIG. 6 is a plan view illustrating a portion of FIG. 5B. In the present embodiment, the same descriptions as in the embodiment of FIGS. 1A to 1D and 2A to 2C will be omitted or mentioned briefly for the purpose of ease and convenience in explanation. In other words, differences between the present embodiment and the above embodiment will be primarily described hereinafter.

Referring to FIG. 5A, first and second semiconductor chips 120 and 220 may be sequentially stacked on a package substrate 100. The second semiconductor chip 220 may include second through electrodes 224 like the first semiconductor chip 120. The second through electrodes 224 may penetrate the second semiconductor chip 220 to be electrically connected to the second circuit layer 222 of the second semiconductor chip 220. Second backside pads 232 may be provided on the second non-active surface 220b of the second semiconductor chip 220 to be electrically connected to the second through electrodes 224.

A first non-conductive film 140 may be disposed between the first semiconductor chip 120 and the package substrate 100. A second non-conductive film 240 may be disposed between the second semiconductor chip 220 and the first semiconductor chip 120.

Next, a third semiconductor chip 320 may be stacked on the second semiconductor chip 220. The third semiconductor chip 320 may include a third active surface 320a on which a third circuit layer 322 is formed, and a third non-active surface 320b that is opposite to the third active surface 320a. For example, the third semiconductor chip 320 may be a memory chip. The third semiconductor chip 320 may include third connection terminals 312 (e.g., solder balls or solder bumps) that are provided on the third active surface 320a to be connected to the third circuit layer 322. A third non-conductive film 340 may be bonded to the third active surface 320a of the third semiconductor chip 320. The third semiconductor chip 320 may be the same as the second semiconductor chip described with reference to FIGS. 1B and 2B.

Referring to FIGS. 5B and 6, the third semiconductor chip 320 may be stacked on the second semiconductor chip 220 in a face-down state in which the third active surface 320a faces the second semiconductor chip 220. Accordingly, the first to third semiconductor chips 120, 220 and 320 may form a stack structure SS, and the stack structure SS may be mounted on the package substrate 100.

According to the present embodiment, when the third semiconductor chip 320 is stacked on the second semiconductor chip 220, all of the first to third non-conductive films 140, 240 and 340 may be thermally compressed to form an adhesive structure AS. The adhesive structure AS may be a single, integral body, or structure, and may substantially fill a first space SP1 between the package substrate 100 and the first semiconductor chip 120, a second space SP2 between the first and second semiconductor chips 120 and 220, and a third space SP3 between the second and third semiconductor chips 220 and 320. Additionally, the first to third non-conductive films 140, 240 and 340 may be thinned by the thermal compression process, thereby forming an extension ASe protruding outward from outer sidewalls of the first to third semiconductor chips 120, 220 and 320. During the thermal compression process, protruding portions of the first to third non-conductive films 140, 240 and 340 may be hardened in a single, integral body, or structure, to form the extension ASe.

The extension ASe may have one continuously convex sidewall ASw. The convex sidewall ASw may be disposed between the level of the first active surface 120a and a level of the third non-active surface 320b. The extension ASe may completely cover at least a pair of opposite sidewalls (120y and 120z of FIG. 2A) of the first semiconductor chip 120 and at least a pair of opposite sidewalls (220y and 220z of FIG. 2B) of the second semiconductor chip 220. The extension ASe may cover portions of at least a pair of opposite sidewalls 320y and 320z of the third semiconductor chip 320. In other words, a top surface of the extension ASe may be disposed at a lower level than the third non-active surface 320b.

A molding layer 108 molding the stack structure SS may be provided on the package substrate 100. In an embodiment, the molding layer 108 may expose the third non-active surface 320b of the third semiconductor chip 320.

Figure 7A:
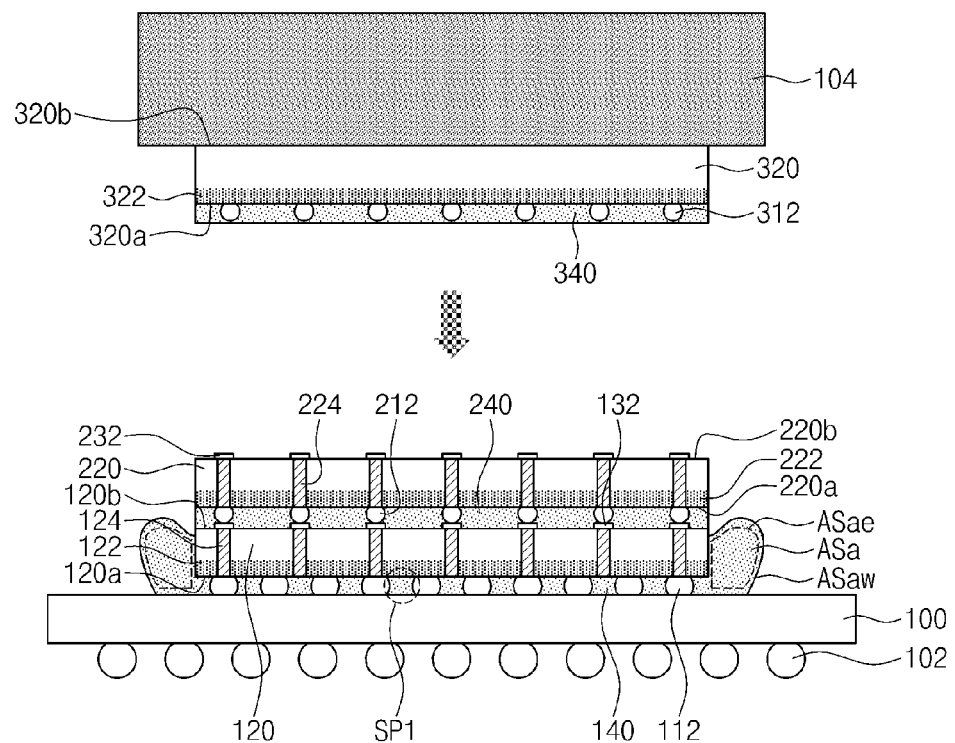
FIGS. 7A and 7B are cross-sectional views illustrating a method for fabricating a semiconductor package according to an embodiment disclosed herein.
Figure 7B:
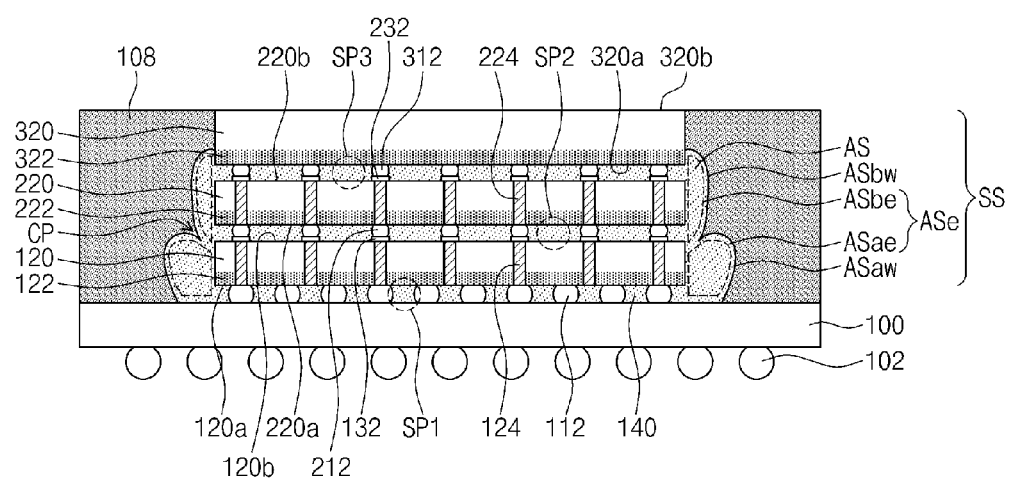

FIGS. 7A and 7B are cross-sectional views illustrating a method for fabricating a semiconductor package according to an embodiment disclosed herein. In the present embodiment, the same descriptions as in the embodiment of FIGS. 5A, 5B and 6 will be omitted or mentioned briefly for the purpose of ease and convenience in explanation. In other words, differences between the present embodiment and the above embodiment will be primarily described hereinafter.

Referring to FIG. 7A, first and second semiconductor chips 120 and 220 may be sequentially stacked on a package substrate 100. Meanwhile, when the first semiconductor chip 120 is stacked on the package substrate 100, a first non-conductive film may be thermally compressed to form a preliminary adhesive structure ASa. The preliminary adhesive structure ASa may fill a first space SP1 between the package substrate 100 and the first semiconductor chip 120. The thermal compression process of the first non-conductive film may be performed under the same conditions as the thermal compression process described with reference to FIGS. 1C and 2C.

Thus, the first non-conductive film may be thinned by the thermal compression process to form a first sub-extension ASae protruding outward from an outer sidewall of the first semiconductor chip 120. The first sub-extension ASae may have one first continuously convex sidewall ASaw. The first convex sidewall ASaw may be disposed between a level of a top surface of the package substrate 100 and a level of the first non-active surface 120b. In detail, the first convex sidewall ASaw may be disposed between a level of the first active surface 120a and a level of the first non-active surface 120b. For example, a top surface of the first sub-extension ASae may be disposed at a higher level than the first non-active surface 120b. Additionally, the first sub-extension ASae may be in direct contact with the top surface of the package substrate 100.

Next, a second semiconductor chip 220 may be stacked on the first semiconductor chip 120. When the second semiconductor chip 220 is stacked, a second non-conductive film 240 may be disposed between the first and second semiconductor chips 120 and 220. Subsequently, a third semiconductor chip 320 may be stacked on the second semiconductor chip 220.

Referring to FIG. 7B, when the third semiconductor chip 320 is stacked on the second semiconductor chip 220, the second and third non-conductive films 240 and 340 may be thermally compressed together to form an adhesive structure AS. During the thermal compression process of the second and third non-conductive films 240 and 340, the preliminary adhesive structure ASa and protruding portions of the second and third non-conductive films 240 and 340 may form one single, integral body, or structure, and may be hardened to form the adhesive structure AS.

Additionally, the second and third non-conductive films 240 and 340 may be thinned by the thermal compression process to form a second sub-extension ASbe protruding outward from outer sidewalls of the second and third semiconductor chips 220 and 320. During the thermal compression process of the second and third non-conductive films 240 and 340, the protruding portions of the second and third non-conductive films 240 and 340 may be hardened in a single, integral body, or structure, to form the second extension ASbe. The second sub-extension ASbe may have one second continuously convex sidewall ASbw. The second convex sidewall ASbw may be disposed between a level of the first non-active surface 120b and a level of the third non-active surface 320b. The extension ASe of the adhesive structure AS may include the first sub-extension ASae and the second sub-extension ASbe.

Meanwhile, at least one sidewall of the extension ASe may include a concave portion CP disposed between the first and second sub-extensions ASae and ASbe. The concave portion CP may be disposed between the level of the first non-active surface 120b and the level of the second active surface 220a.

A molding layer 108 molding the stack structure SS may be provided on the package substrate 100. In an embodiment, the molding layer 108 may expose the third non-active surface 320b of the third semiconductor chip 320.

According to the method for fabricating the semiconductor package described with reference to FIGS. 7A and 7B, the thermal compression processes may be respectively performed on the semiconductor chip initially stacked on the package substrate 100 and the semiconductor chip corresponding to the uppermost one of the stack structure SS. In other words, two thermal compression processes may be performed. Since the first thermal compression process is performed on the semiconductor chip initially stacked on the package substrate 100, the semiconductor chip corresponding to a base of the stack structure SS may be firmly mounted on the package substrate 100.

The fabricating method according to the present embodiment may be applied to four or more semiconductor chips stacked on the package substrate 100, as well as three semiconductor chips stacked on the package substrate 100. In other words, the two thermal compression processes may be performed on the first semiconductor chip and the last semiconductor chip, respectively.

Figure 8A:
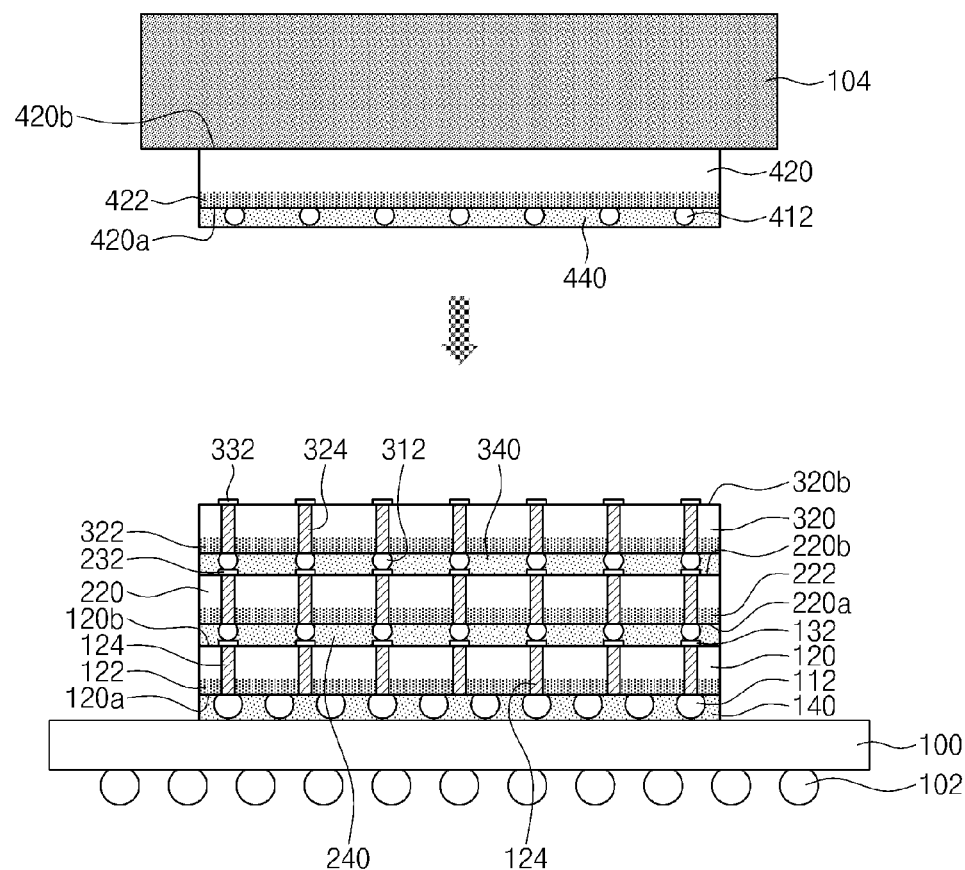
FIGS. 8A and 8B are cross-sectional views illustrating a method for fabricating a semiconductor package according to an embodiment disclosed herein.
Figure 8B:
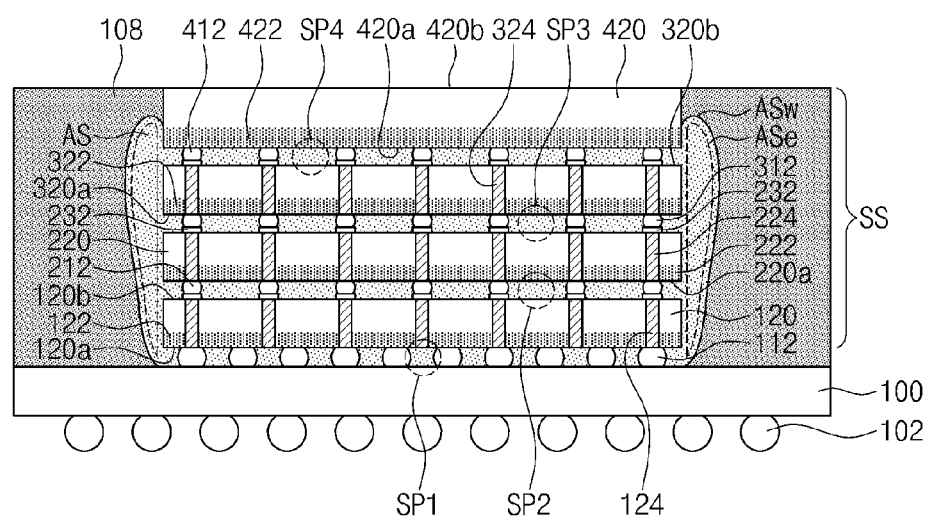
Figure 9:
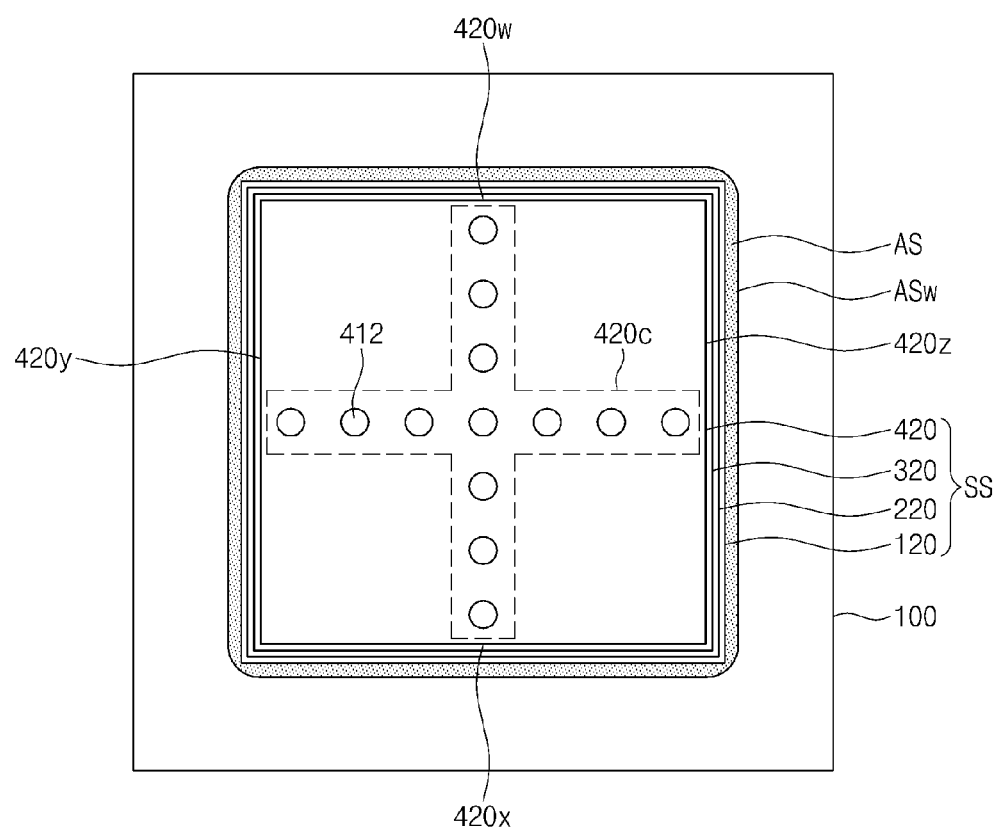
FIG. 9 is a plan view illustrating a portion of FIG. 8B.

FIGS. 8A and 8B are cross-sectional views illustrating a method for fabricating a semiconductor package according to an embodiment disclosed herein. FIG. 9 is a plan view illustrating a portion of FIG. 8B. In the present embodiment, the same descriptions as in the embodiment of FIGS. 5A, 5B and 6 will be omitted or mentioned briefly for the purpose of ease and convenience in explanation. In other words, differences between the present embodiment and the above embodiment will be primarily described hereinafter.

Referring to FIG. 8A, first to third semiconductor chips 120, 220 and 320 may be sequentially stacked on a package substrate 100. The third semiconductor chip 320 may include third through electrodes 324, like the first and second semiconductor chips 120 and 220. The third through electrodes 324 may penetrate the third semiconductor chip 320 to be electrically connected to the third circuit layer 322 of the third semiconductor chip 320. Third backside pads 332 may be provided on the third non-active surface 320b of the third semiconductor chip 320 to be electrically connected to the third through electrodes 324.

A first non-conductive film 140 may be disposed between the first semiconductor chip 120 and the package substrate 100, and a second non-conductive film 240 may be disposed between the first and second semiconductor chips 120 and 220. A third non-conductive film 340, which is also rarely, varied may be disposed between the second and third semiconductor chips 220 and 320.

Next, a fourth semiconductor chip 420 may be stacked on the third semiconductor chip 320. The fourth semiconductor chip 420 may include a fourth active surface 420a on which a fourth circuit layer 422 is formed, and a fourth non-active surface 420b that is opposite to the fourth active surface 420a. For example, the fourth semiconductor chip 420 may be a memory chip. The fourth semiconductor chip 420 may include fourth connection terminals 412 (e.g., solder balls or solder bumps) which are provided on the fourth active surface 420a to be connected to the fourth circuit layer 422. A fourth non-conductive film 440 may be bonded to the fourth active surface 420a of the fourth semiconductor chip 420. The fourth semiconductor chip 420 may be the same as the second semiconductor chip described with reference to FIGS. 1B and 2B.

Referring to FIGS. 8B and 9, the fourth semiconductor chip 420 may be stacked on the third semiconductor chip 320 in a face-down state in which the fourth active surface 420a faces the third semiconductor chip 320. Accordingly, the first to fourth semiconductor chips 120, 220, 320 and 420 may form a stack structure SS, and the stack structure SS may be mounted on the package substrate 100.

According to the present embodiment, when the fourth semiconductor chip 420 is stacked on the third semiconductor chip 320, all of the first to fourth non-conductive films 140, 240, 340 and 440 may be thermally compressed to form an adhesive structure AS. The adhesive structure AS may be in a single, integral body, or structure, and may substantially fill a first space SP1 between the package substrate 100 and the first semiconductor chip 120, a second space SP2 between the first and second semiconductor chips 120 and 220, a third space SP3 between the second and third semiconductor chips 220 and 320, and a fourth space SP4 between the third and fourth semiconductor chips 320 and 420. Additionally, the first to fourth non-conductive films 140, 240, 340 and 440 may be thinned by the thermal compression process, thereby forming an extension ASe protruding outward from outer sidewalls of the first to fourth semiconductor chips 120, 220, 320 and 420. During the thermal compression process, protruding portions of the first to fourth non-conductive films 140, 240, 340 and 440 may be hardened in a single, integral body, or structure, to form the extension ASe.

The extension ASe may have one continuously convex sidewall ASw. The convex sidewall ASw may be disposed between the level of the first active surface 120a and a level of the fourth non-active surface 420b. The extension ASe may completely cover at least a pair of opposite sidewalls (120y and 120z of FIG. 2A) of the first semiconductor chip 120, at least a pair of opposite sidewalls (220y and 220z of FIG. 2B) of the second semiconductor chip 220, and at least a pair of opposite sidewalls (320y and 320z of FIG. 6) of the third semiconductor chip 320. The extension ASe may cover portions of at least a pair of opposite sidewalls 420y and 420z of the fourth semiconductor chip 420. In other words, a top surface of the extension ASe may be disposed at a lower level than the fourth non-active surface 420b.

A molding layer 108 molding the stack structure SS may be provided on the package substrate 100. In an embodiment, the molding layer 108 may expose the fourth non-active surface 420b of the fourth semiconductor chip 420.

Figure 10:
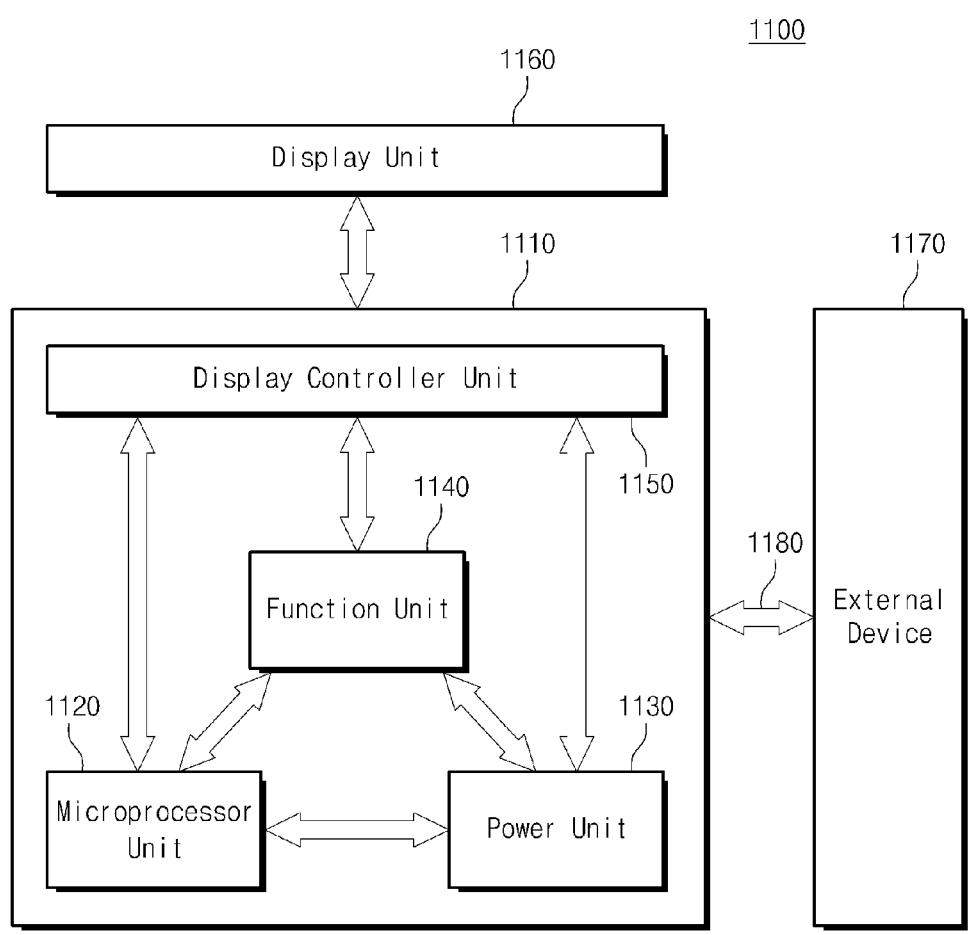
FIG. 10 is a schematic block diagram illustrating an embodiment of an electronic system including a semiconductor package according to embodiments disclosed herein.

FIG. 10 is a schematic block diagram illustrating an embodiment of an electronic system including a semiconductor package according to embodiments disclosed herein.

Referring to FIG. 10, a semiconductor package according to embodiments disclosed herein may be applied to an electronic system 1100. The electronic system 1100 may include a body 1110, a microprocessor unit 1120, a power unit 1130, a function unit 1140, and a display controller unit 1150. The body 1110 may include a set board formed of a printed circuit board. The microprocessor unit 1120, the power unit 1130, the function unit 1140, and the display controller unit 1150 may be mounted on the body 1110.

The power unit 1130 may be supplied with a predetermined voltage from an external battery (not shown) and may generate demanded voltage levels by means of the predetermined voltage. The power unit 1130 may respectively supply the generated voltage levels to the microprocessor unit 1120, the function unit 1140, and the display controller unit 1150.

The microprocessor unit 1120 may be supplied with the voltage from the power unit 1130 to control the function unit 1140 and a display unit 1160. The function unit 1140 may perform various functions of the electronic system 1100. For example, if the electronic system 1100 is a portable phone, the function unit 1140 may include components performing portable phone functions, such as, but not limited to, a dialing function, a function of outputting an image to the display unit 1160 by communicating with an external device 1170, and a function of outputting a voice through a speaker. If the electronic system 1100 includes a camera, the function unit 1140 may function as a camera image processor. For example, when the electronic system 1100 is connected to a memory card to expand a data storage capacity, the function unit 1140 may include a memory card controller. The function unit 1140 may exchange electrical signals with the external device 1170 through a cable or wireless communication unit 1180. For example, if the electronic system 1100 uses a universal serial bus (USB) for function expansion, the function unit 1140 may function as an interface controller. At least one of the semiconductor packages according to the aforementioned embodiments disclosed herein may be used in at least one of the microprocessor unit 1120 or the function unit 1140.

Figure 11:
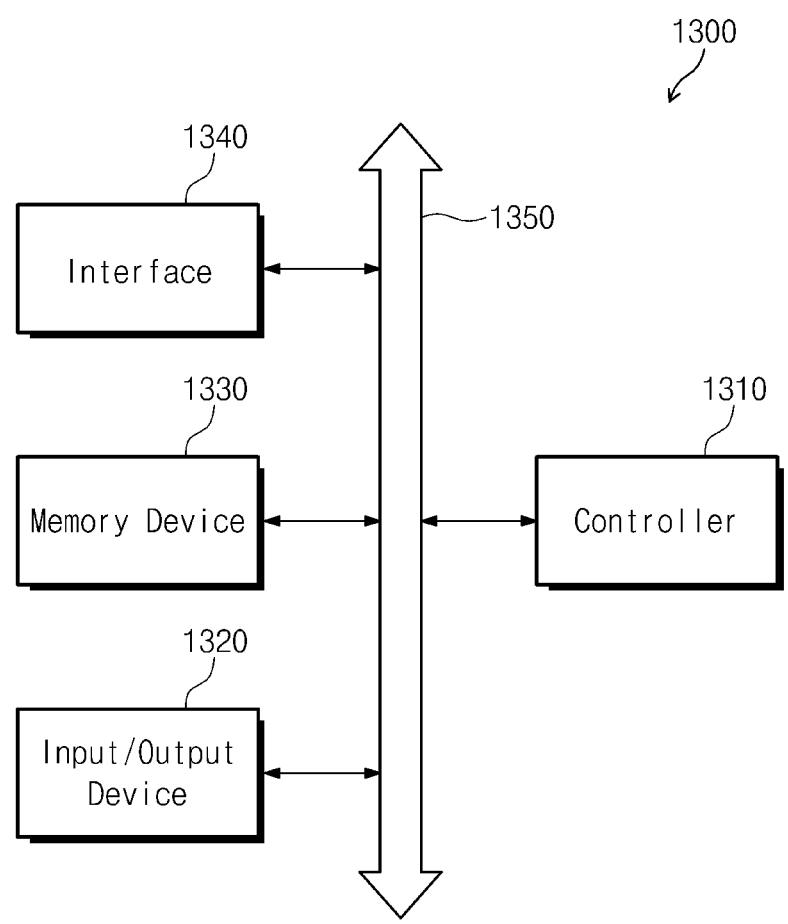
FIG. 11 is a schematic block diagram illustrating an embodiment of an electronic system including a semiconductor package according to embodiments disclosed herein.

FIG. 11 is a schematic block diagram illustrating an embodiment of an electronic system including a semiconductor package according to embodiments disclosed herein.

Referring to FIG. 11, an electronic system 1300 may include a controller 1310, an input/output (I/O) device 1320 and a memory device 1330. The controller 1310, the I/O device 1320, and the memory device 1330 may communicate with each other through a data bus 1350. The data bus 1350 may correspond to a path through which electrical signals are transmitted. For example, the controller 1310 may include at least one of a microprocessor, a digital signal processor, a microcontroller, or other logic device capable of performing a similar function to any one thereof. At least one of the controller 1310 and the memory device 1330 may include at least one of the semiconductor packages according to the aforementioned embodiments disclosed herein. The I/O device 1320 may include a keypad, a keyboard and/or a display device. The memory device 1330 may be a device storing data. The memory device 1330 may store data and/or commands to be executed by the controller 1310. The memory device 1330 may include a volatile memory device and/or a non-volatile memory device. In an embodiment, the memory device 1330 may include a flash memory device. For example, the flash memory device to which the technique disclosed herein is applied may be installed in the electronic system 1300, such as a mobile device or a desktop computer. The flash memory device may be realized as a solid-state disk (SSD). In this case, the electronic system 1300 may stably store massive data in the flash memory device. The electronic system 1300 may further include an interface unit 1340 that transmits electrical data to a communication network and/or receives electrical data from the communication network. The interface unit 1340 may operate by wireless or cable. For example, the interface unit 1340 may include an antenna or a cable/wireless transceiver. Although not shown in the drawings, the electronic system 1300 may further include an application chipset and/or a camera image processor (CIP).

The semiconductor package according to the embodiments disclosed herein includes the adhesive structure filling the spaces between the package substrate and the stacked chips so the mechanical endurance of the semiconductor package may be excellent. Additionally, the adhesive structure may be formed by performing one thermal compression process on a plurality of non-conductive films, and thus, efficiency of the manufacturing processes may be improved. Additionally, the adhesive structure may have one continuously convex sidewall.

While the subject matter disclosed herein has been described with reference to example embodiments, it will be apparent to those skilled in the art that various changes and modifications may be made without departing from the scope of the claimed subject matter. Therefore, it should be understood that the above embodiments are not limiting, but illustrative. Thus, the scope of the claimed subject matter is to be determined by the broadest permissible interpretation of the following claims and their equivalents, and shall not be restricted or limited by the foregoing description.

What is claimed is:

1. A semiconductor package, comprising:
a first semiconductor chip stacked on a package substrate, the first semiconductor chip including a first surface facing the package substrate and a second surface opposite to the first surface;
a second semiconductor chip stacked on the first semiconductor chip, the second semiconductor chip including a third surface facing the second surface of the first semiconductor chip and a fourth surface opposite to the third surface; and
an integral adhesive structure, the integral adhesive structure substantially filling a first space between the package substrate and the first semiconductor chip and a second space between the first and second semiconductor chips,
wherein the integral adhesive structure includes an extension protruding from outer sidewalls of the first and second semiconductor chips,
wherein the extension has one continuously convex sidewall between a level of the first surface to a top surface of the extension,
wherein the top surface of the extension is disposed at a lower level than the fourth surface, and
wherein the top surface of the extension is rounded such that an upper portion of the extension adjacent to the second semiconductor chip has a width decreasing in a direction away from the package substrate.

2. The semiconductor package of claim 1, wherein the extension is in direct contact with a top surface of the package substrate.

3. The semiconductor package of claim 1, wherein the first semiconductor chip comprises: at least one first through electrode penetrating the first semiconductor chip from the first surface to the second surface.

4. The semiconductor package of claim 3, wherein the second semiconductor chip comprises: at least one second connection terminal electrically connected to the at least one first through electrode.

5. The semiconductor package of claim 1, further comprising:
a third semiconductor chip disposed between the package substrate and the first semiconductor chip, the third semiconductor chip including a fifth surface facing the package substrate and a sixth surface facing the first semiconductor chip,
wherein the integral adhesive structure further substantially fills a third space between the package substrate and the third semiconductor chip, and
wherein the first space is a space between the first and third semiconductor chips.

6. The semiconductor package of claim 5, wherein the extension has one continuously convex sidewall between a level of the fifth surface and the top surface of the extension.

7. The semiconductor package of claim 5, wherein the extension comprises: a first sub-extension; and a second sub-extension on the first sub-extension,
wherein the first sub-extension has one first continuously convex sidewall between a level of a top surface of the package substrate and a level of the sixth surface, and
wherein the second sub-extension has one second continuously convex sidewall between the level of the sixth surface and the top surface of the extension.

8. The semiconductor package of claim 5, wherein the extension covers a pair of opposite sidewalls of the first semiconductor chip and a pair of opposite sidewalls of the third semiconductor chip.

9. The semiconductor package of claim 5, wherein the third semiconductor chip comprises: at least one first through electrode penetrating the third semiconductor chip from the fifth surface to the sixth surface,
wherein the first semiconductor chip comprises:
at least one second through electrode penetrating the first semiconductor chip from the first surface to the second surface; and
at least one connection terminal electrically connecting the at least one second through electrode to the at least one first through electrode.

10. The semiconductor package of claim 1, further comprising:
a third semiconductor chip disposed between the package substrate and the first semiconductor chip; and
a fourth semiconductor chip disposed between the package substrate and the third semiconductor chip,
wherein the integral adhesive structure further substantially fills a third space between the third and fourth semiconductor chips and a fourth space between the package substrate and the fourth semiconductor chip, and
wherein the first space is a space between the first and third semiconductor chips.

11. The semiconductor package of claim 10, wherein the extension covers sidewalls of the first, third and fourth semiconductor chips.

12. A semiconductor package, comprising:
a first semiconductor chip including through electrodes penetrating the first semiconductor chip between a first active surface and a first non-active surface that is opposite to the first active surface, the first semiconductor chip being mounted on a package substrate in a face-down state in which the first active surface faces the package substrate;
a second semiconductor chip including a second active surface and a second non-active surface that is opposite to the second active surface, connection terminals provided on the second active surface, the connection terminals being electrically connected to the through electrodes, and the second semiconductor chip being stacked on the first semiconductor chip in a face-down state in which the second active surface faces the first non-active surface;

an integral adhesive structure provided on the package substrate to fix the first and second semiconductor chips, and a molding layer provided on the package substrate to mold the first and second semiconductor chips, wherein the integral adhesive structure includes an extension that protrudes from outer sidewalls of the first and second semiconductor chips to cover at least a pair of sidewalls of the first semiconductor chip, wherein a top surface of the molding layer is coplanar with the second non-active surface, wherein a top surface of the extension is disposed at a lower level than the second non-active surface, and wherein the molding layer covers the top surface of the extension and upper sidewalls of the second semiconductor chip.

13. The semiconductor package of claim 12, wherein the integral adhesive structure substantially fills a first space between the package substrate and the first semiconductor chip and a second space between the first and second semiconductor chips.

14. The semiconductor package of claim 12, wherein the extension has one continuously convex sidewall between a level of the first active surface and a top surface of the extension.

15. The semiconductor package of claim 12,
wherein the connection terminals are spaced apart from the molding layer by the integral adhesive structure.

16. A semiconductor package, comprising:
a plurality of semiconductor chips stacked on each other with a space between each semiconductor chip, each semiconductor chip including a top surface, a bottom surface and a pair of sidewalls, each top surface being opposite a corresponding bottom surface and each pair of sidewall being opposite each other and extending between a corresponding top surface and bottom surface; and an integral adhesive structure substantially continuously filling each space between the stacked semiconductor chips and substantially continuously covering at least one pair of sidewalls of at least one semiconductor chip that is adjacent to at least one space between the stacked semiconductor chips, wherein a portion of the integral adhesive structure substantially continuously covering the at least one pair of sidewalls of the at least one semiconductor chip comprises a substantially convex sidewall surface that extends outwardly from the at least one pair of sidewalls from a bottom semiconductor chip of the plurality of semiconductor chips to a top surface of the extension, wherein the top surface of the extension is disposed at a lower level than a top semiconductor chip of the plurality of semiconductor chips, and wherein the top surface of the extension is rounded such that an upper portion of the extension adjacent to the top semiconductor chip has a width decreasing in a direction away from the bottom semiconductor chip.

17. The semiconductor package according to claim 16, wherein at least one semiconductor chip of the plurality of semiconductors chips comprises at least one through via extending from the top surface of the semiconductor chip to the bottom surface of the semiconductor chip.

18. The semiconductor package according to claim 16, further comprising a molding layer substantially surrounding the stack of the plurality of semiconductor chips.

* * * * *